(12) United States Patent
Ausserlechner et al.

(10) Patent No.: US 7,599,226 B2
(45) Date of Patent: Oct. 6, 2009

(54) MEMORY CIRCUIT, DRIVE CIRCUIT FOR A MEMORY AND METHOD FOR WRITING WRITE DATA INTO A MEMORY

(75) Inventors: Udo Ausserlechner, Villach (AT); Martin Mueller, Reisach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/275,360

(22) Filed: Nov. 21, 2008

(65) Prior Publication Data
US 2009/0073773 A1 Mar. 19, 2009

Related U.S. Application Data

(62) Division of application No. 11/562,487, filed on Nov. 22, 2006, now Pat. No. 7,466,596.

(30) Foreign Application Priority Data
Nov. 23, 2005 (DE) ........................ 10 2005 055 834

(51) Int. Cl.
*G11C 11/34* (2006.01)
(52) U.S. Cl. ............................ 365/185.23; 365/185.26
(58) Field of Classification Search ............ 365/185.23, 365/185.26, 230.06
See application file for complete search history.

(56) References Cited

U.S. PATENT DOCUMENTS

| | | | | |
|---|---|---|---|---|
| 4,596,938 A | 6/1986 | Cartwright, Jr. | | |
| 6,128,230 A * | 10/2000 | Amanai | ................ | 365/185.23 |
| 6,459,616 B1 | 10/2002 | Beauchamp et al. | | |
| 6,570,811 B1 * | 5/2003 | Morikawa | ............... | 365/230.06 |
| 6,795,347 B2 | 9/2004 | Ausserlechner et al. | | |
| 7,064,985 B2 * | 6/2006 | Kuo | ..................... | 365/185.23 |
| 7,203,118 B2 * | 4/2007 | Yaoi et al. | ................... | 365/226 |
| 2003/0189865 A1 | 10/2003 | Ausserlechner et al. | | |
| 2004/0042272 A1 | 3/2004 | Kurata | | |
| 2007/0189075 A1 | 8/2007 | Ausserlechner et al. | | |

FOREIGN PATENT DOCUMENTS

| DE | 102 14 898 A1 | 10/2003 |
|---|---|---|
| WO | WO 02/071408 A1 | 9/2002 |

* cited by examiner

*Primary Examiner*—Anh Phung
(74) *Attorney, Agent, or Firm*—Eschweiler & Associates, LLC

(57) ABSTRACT

A first and second non-volatile memory transistor each have a floating gate electrode and a gate terminal. A first switch is connected between a first drain terminal and a bit line for reading out information, and a second switch is connected between a second drain terminal and the bit line. The first and second switch are designed to selectively couple the first or second drain terminal to the bit line during readout. A drive circuit is designed to write data into one of the transistors and to apply equal signals to the gate terminals of the first and second transistors based on the data, to apply a programming signal at a source terminal of the transistor to be written to and to drive a source terminal of a transistor not to be written to such that a state stored in the transistor not to be written to is not changed.

18 Claims, 9 Drawing Sheets

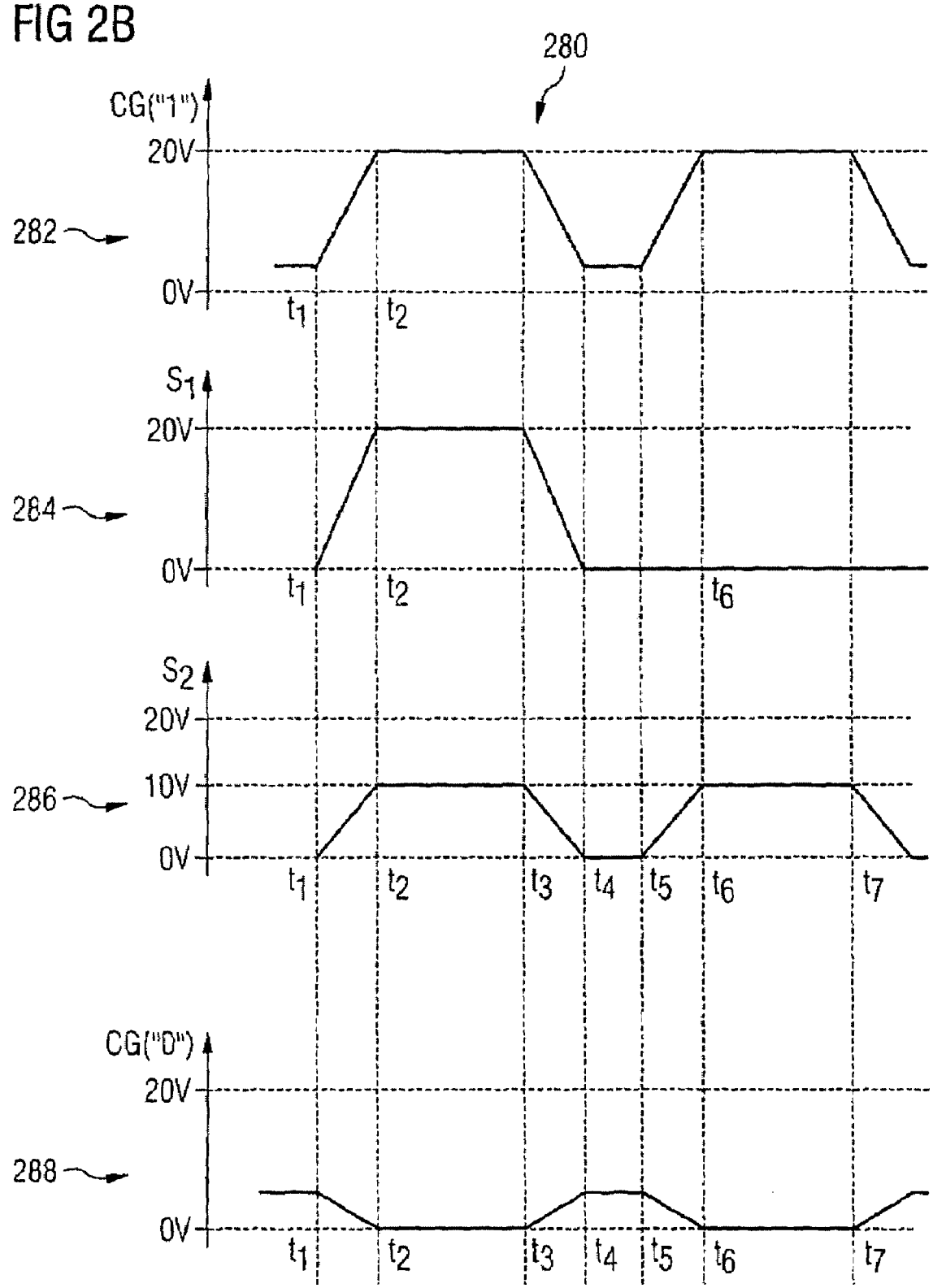

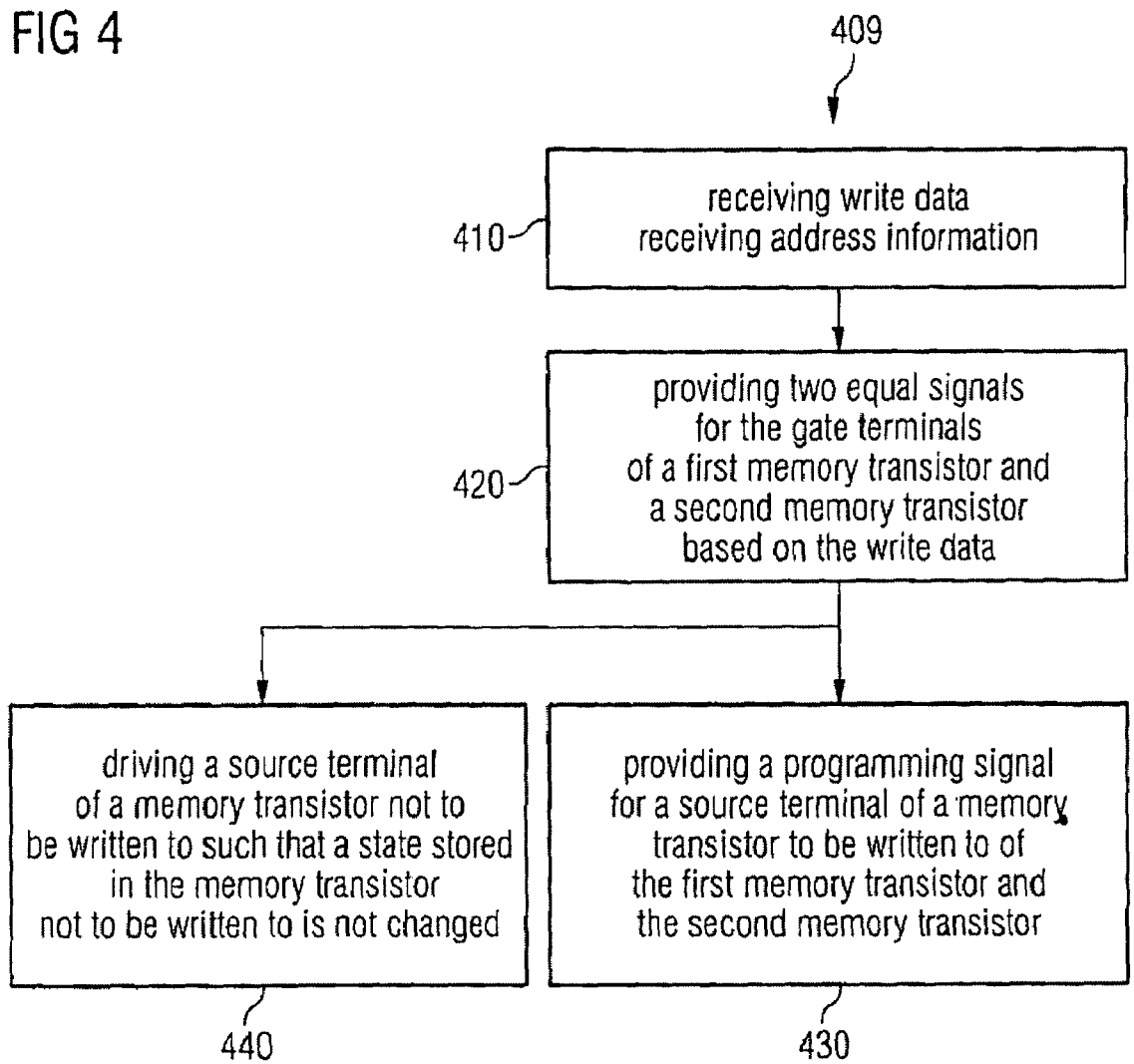

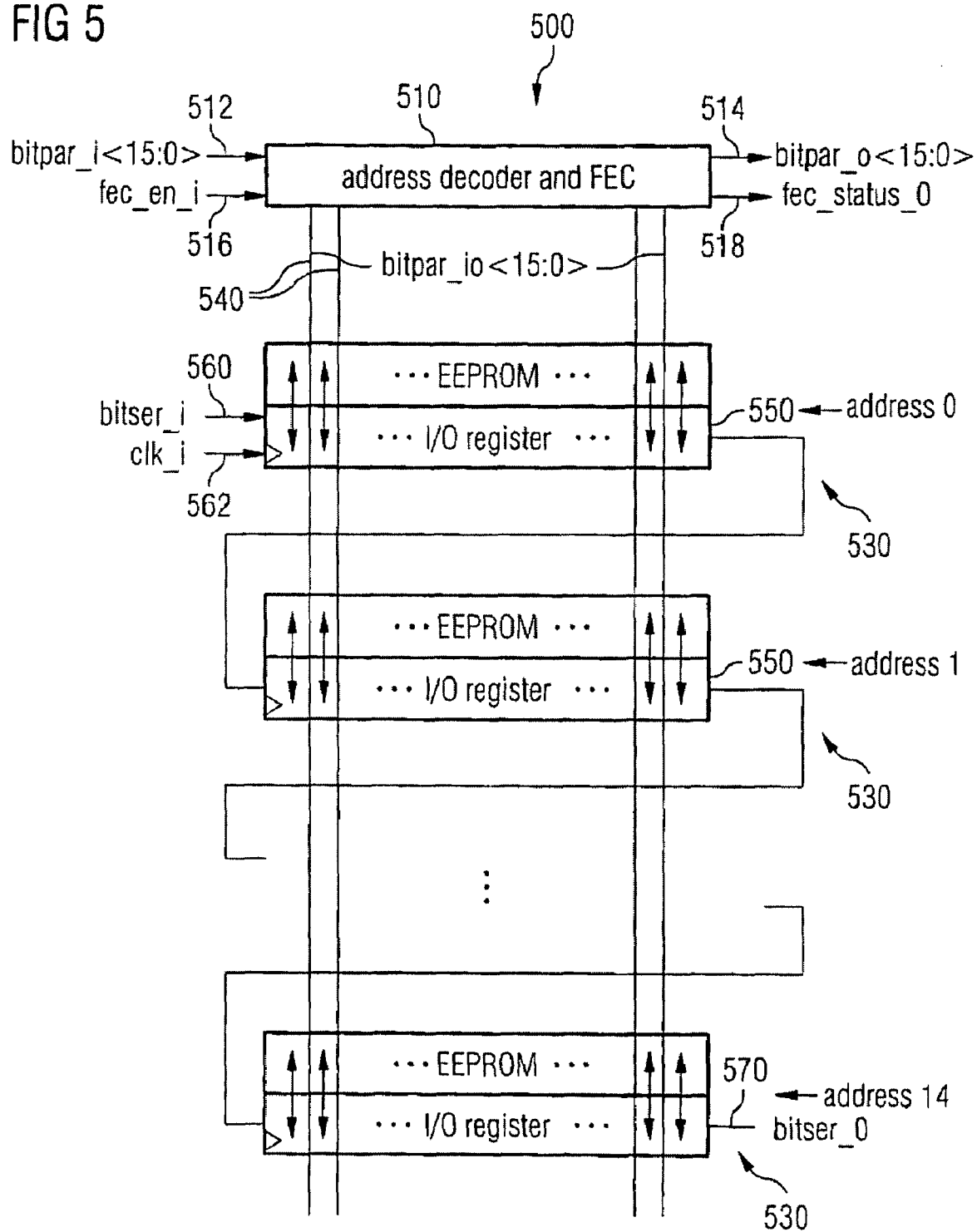

MEMORY CIRCUIT, DRIVE CIRCUIT FOR A MEMORY AND METHOD FOR WRITING WRITE DATA INTO A MEMORY

RELATED APPLICATION

This application is a divisional of U.S. application Ser. No. 11,562,487 filed on Nov. 22, 2006, now U.S. Pat. No. 7,466, 596, issued on Dec. 16, 2008 that claims priority from German Patent Application No. DE 10 2005 055 834.8 which was filed on Nov. 23, 2005 and is incorporated herein by reference in its entirety.

TECHNICAL FIELD

The present invention generally relates to a memory circuit, a drive circuit for a memory and a method for writing write data into a memory, particularly to an EEPROM of low integration density with improved space requirements (small scale EEPROM with improved space consumption) as well as to an associated drive circuit and an associated method for writing in data.

BACKGROUND

In many fields of application, it is desirable to produce an integrated circuit (IC) containing analog and digital circuits and additionally a storage medium. One example are integrated sensors, where highly precise analog circuits with sophisticated digital signal processing circuits are used on the same IC and/or are integrated in the same IC. Furthermore, it is preferred that the above integrated sensors store their calibration data in a memory. Here, no additional (extra) process step should become necessary for the memory when producing the corresponding integrated sensor.

Thus, the corresponding task to integrate a memory into an integrated circuit with analog and digital circuit parts without requiring an additional process step during production for producing the memory strongly conflicts with the requirements for the production of usual highly integrated memory circuits (memory ICs), wherein processes specifically adapted for a realization of memory structures (dedicated processes) may be used.

An EEPROM is particularly suitable for use in an integrated sensor, because here a change and/or iteration of the calibration is easily possible by multiple programming. In most cases, only a small amount of data of about 50 to 500 bits is required for the calibration of a sensor. Therefore, the EEPROMs used in connection with integrated sensors differ significantly from "dedicated" highly integrated EEPROMs in their architecture. When using an EEPROM in connection with an integrated sensor, it is particularly important to consume as little chip area as possible for the EEPROM, to be able to access the data in the EEPROM quickly, and to guarantee continued extremely high reliability. Furthermore, it has been shown that it is necessary for achieving a minimum chip area for the EEPROM to keep the requirements of drive circuits, such as high voltage switches, multiplexers and address decoders, particularly small as compared to highly integrated EEPROMs.

DE 102 14 898 A1 shows a space-saving drive circuit for programming an EEPROM using slightly adapted standard low voltage CMOS transistors. The above document shows an EEPROM architecture in which a gate control terminal of each cell is driven by a high voltage PMOS transistor and a high voltage NMOS transistor. A drain terminal of the EEPROM-NMOS transistor having a floating gate for the storage of information is connected to a standard CMOS logic via a high voltage PMOS transistor. The above patent application further shows an architecture in which a high voltage NMOS transistor is located between the drain of the EEPROM transistor and the standard CMOS logic.

U.S. Pat. No. 4,596,938 shows a series connection of channel paths of field effect transistors with electrically changeable threshold voltage between operational voltage clamps. Here, one of the transistors is programmed to assume a conductive state, while the other one of the two transistors is programmed to assume a non-conductive state. The programming is done in response to a programming voltage applied to the two gate terminals of the transistors connected to each other. The described circuit, forms a programmable data memory (also referred to as latch). A pair of such data memories (latches) forms a programmable complementary data memory (latch). The programmable complementary data memory may be used to selectively activate a transfer gate with a complementary pair or to selectively activate a logic inverter with a complementary pair. The programmable complementary data memory may further be used to alternatively activate a transfer gate and a logic inverter. The above mode of operation may, for example, be used to selectively invert a logic input or not.

The US patent application 2004/0042272 A1 shows a semiconductor storage means with memory cells, source lines, drain lines and drive gate lines. The memory cells are arranged in a matrix. Adjacent memory cells in the column direction have one of a source line and a drain line in common. The source terminals of memory cells of two adjacent columns are connected to a common source line. The drain terminals of memory cells of two adjacent columns are further connected to a common drain line. The drain terminals of two memory cells of two columns connected to the source line are connected to different drain lines, respectively. The gate terminals of adjacent memory cells in the row direction are connected to a common drive gate line.

The international patent application WO 02/071403 A1 shows an EEPROM with reduced circuit load of a high voltage write impulse. The reduced load is achieved by dividing a field of bit cells into two or more switchable segments with common source line. Only segments with common source line containing the bit cells to be written to are connected. The other segments with common source line remain open (nonconnected) and do not contribute significantly to a loading of the write impulse. The presence of several switchable segments reduces the size of the parasitic capacitance connected in the EEPROM during a write operation. Thus, the load of the write circuits is reduced.

Furthermore, an EEPROM architecture is known according to which all cells in a chain are arranged linearly. For example, FIG. 5 shows a block circuit diagram of an EEPROM architecture realized, for example, in the products KP115 and TL4997D of the applicant.

The EEPROM architecture of FIG. 5 is designated 500 in its entirety. The EEPROM architecture 500 includes a first block 510 serving as address decoder and error correction means (FEC). The first block 510 receives data to be written into the EEPROM in parallel form as parallel data signals 512 and also provides data read from the EEPROM as parallel data signals 514. The first block 510 further receives a signal 516 for activating the error correction (fee_en_i). Furthermore, the first block 510 outputs the state of the error correction via a signal 518 (fec_status_o). The EEPROM architecture 500 further comprises a plurality of, for example, 15 EEPROM banks 530 with which various addresses (for example in the range between 0 and 14) are associated. Input/ output registers (I/O registers) 550 of the EEPROM banks 530 are connected to column data lines 540 running in parallel, so that several EEPROM banks 530 share the same column lines. Besides, the input/output registers 550 of the EEPROM banks 530 are respectively coupled to the actual EEPROM memory cells, here briefly referred to as EEPROM. The input/output registers 550 of the EEPROM banks 530 are further designed to receive data to be written as a serial input signal 560 and to pass them on synchronously to a clock signal 562 in the manner of a shift register. The EEPROM banks 530 are connected such that data are shifted on serially from the input/output register 550 of a first memory bank to the input/output register 550 of a following EEPROM bank. At the last EEPROM bank 530, with which, for example, the address 14 is associated, there is further available a serial output signal 570. The EEPROM structure 500 thus allows both parallel input and output of write or read data and serial input or output of the write or read data.

In other words, a basically linear sequence of EEPROM and an associated input/output register 550 is folded into several rows in the EEPROM architecture 500. In a vertical direction, an input/output line 540 is passed through for each cell per row, which is also referred to as parallel column data line 540 (bitpar_io<15:0>). For example, when reading out the data from the EEPROM bank 530 (also referred to as EEPROM row) with the address 1, the data of the EEPROM bank 530 with the address 1 are applied to the vertical parallel column data lines (bitpar_io<15:0>) by activating the corresponding EEPROM bank (EEPROM row) alone via address coding and/or address decoding. Thus, the linear structure is converted to a matrix-like structure.

The input signal 516 for activating the error correction (also referred to as fec_en_i) activates an automatic error detection and/or error correction and may thus be considered as enable signal for forward error coding (forward error coding ENable). During the automatic error detection and/or error correction, toggling of a bit in the memory may be detected and corrected due to a matrix parity code.

FIG. 6 shows an architecture of a known EEPROM cell including its associated register cell. The architecture of FIG. 6 is designated 600 in its entirety. The center of the known architecture 600 is an EEPROM memory transistor 610 with a floating gate electrode 612. The EEPROM memory transistor 610 further comprises a gate terminal 614 connected to a gate drive circuit 620. The gate drive circuit 620 includes a first high voltage PMOS transistor 622 operating as current source. The gate drive circuit 620 further includes a first, high voltage NMOS transistor 624, whose drain terminal is coupled to the drain terminal of the first high voltage PMOS transistor 622 and to the gate terminal 614 of the EE PROM-NMOS transistor 610. A source terminal of the first high voltage NMOS transistor 624 is further coupled to a low potential 626. A drive circuit 630 consisting of a low voltage PMOS transistor and a low voltage NMOS transistor is designed to drive the gate of the first high voltage NMOS transistor 624 so that the first high voltage NMOS transistor 624 is switched on in read operation, and to further ensure that the first high voltage NMOS transistor 624 is switched on or switched off (i.e. put into a conductive or non-conductive state) in write operation (also referred to as "write or erase operation") depending on data 634 to be written.

A drain terminal of the EEPROM-NMOS transistor 610 may further be coupled to an input of a multiplexer and/or switch 642 via a second high voltage NMOS transistor 640. Furthermore, the EEPROM-NMOS transistor 610 may be coupled to a second (low voltage) PMOS transistor 644, which may act as current source, via the second high voltage NMOS transistor 640 to thus impress a current on the EEPROM-NMOS transistor 610.

The architecture 600 further includes an EEPROM input/output register cell 650 designed to receive or provide data to be written or read data in parallel or serial form. The architecture 600 further includes switches and/or logic to be able to pass on serial data to further EEPROM cells. In addition, the architecture 600 includes an XOR gate 660 designed to allow calculation of a parity and to receive a data value present at the output of the EEPROM input/output register cell 650 and to combine it with parity information from another EEPROM cell.

It is further to be noted that there is a supply voltage for a CMOS logic present at the source terminal of the PMOS transistor 644, which is also referred to as VDDD. Thus, the supply voltage VDD may, for example, also supply the EEPROM input/output register cell 650 and/or the XOR gate 660 and/or the multiplexer 642 with electric energy.

The following describes the procedure when programming the EEPROM memory cell 600. First, it is to be noted that the data to be written are present as logic levels in inverted form on the line 634, also referred to as bit_n. In other words, if a logical "0" is to be written, a positive voltage is present on the line 634, preferably close to VDDD, whereas when writing a logical "1", a voltage of 0 volts is present on the line 634. When writing, a programming impulse of, for example, 20 volts is further applied to the programming voltage line 670 for a duration of, for example, about ten milliseconds (wherein the programming voltage line 670 is also referred to as write_pin).

If a logical "0" is to be programmed, the erase line 672 (also referred to as erase_pin) coupled to the source terminal of the EEPROM transistor 610 is further also at the same potential as the write voltage line 670 (write_pin). Furthermore, there is typically a voltage of 0 volts on the source line 626 for the first high voltage NMOS transistor 624, when programming. At a gate terminal of the first high voltage PMOS transistor 622, there is further typically a potential about 1 to 2 volts lower than the potential on the write voltage line 670, wherein the write voltage line 670 is coupled to a source terminal of the first high voltage PMOS transistor 622. The first high voltage PMOS transistor 622 thus operates as a current source supplying a current approximately between 0.5 microampere and 5 microampere.

A bit to be programmed is loaded into the EEPROM input/output register cell 650 prior to actual programming. The control line 674 for the drive circuit 630, also referred to as "WorE", is put to the supply potential VDDD of the CMOS circuit part when programming a logical "1" and when programming a logical "0". It is to be noted that programming a logical "1" is considered to be writing, which is also designated "W" or "WRITE". In contrast, programming a logical "0" is considered to be erasing, which is also designated "E" or "ERASE".

If a logical "1" is to be programmed, the logical "1" is first loaded into a register cell of the EEPROM input/output register cell 650. Thus, the data line 634 with the data to be written is at 0 volt (bit_n= 0 volt), because the data to be written are present in inverted form on the data line 634. Thus, the gate terminal of the first high voltage NMOS transistor 624 becomes 0 volt and/or logically "low" via the drive circuit 630, and the first high voltage NMOS transistor 624 blocks. However, the first high voltage PMOS transistor 622 loads the gate terminal 614 of the EEPROM-NMOS transistor 610 and/or the associated circuit node up to the programming voltage. In other words, there is thus a voltage at the gate terminal 614 of the EEPROM-NMOS transistor 610 that differs only insignificantly and/or minimally from the programming voltage on the write voltage line 670. The gate terminal 614 of the EEPROM-NMOS transistor 610, which thus serves as control gate terminal, thus is at approximately 20 volts, whereas a potential of about 0 volts is supplied at the source terminal of the EEPROM-NMOS transistor 610 via the erase line 672 in the write mode (when writing a logical "1"). Thus, there is a high voltage at a gate oxide (GOX) of the EEPROM-NMOS transistor 610, so that electrons tunnel from the source terminal of the EEPROM-NMOS transistor 610 through the gate oxide to the floating gate 612 of the EEPROM-NMOS transistor 610. If subsequently the programming voltage of the write voltage line 670 is turned off, the above-mentioned electrons are caught on the floating gate electrode 612 of the EEPROM-NMOS transistor 610. Thus, a differential voltage of, for example, 3 volts is stored on a launching capacitor between the gate terminal 614 (CG1) of the EEPROM-NMOS transistor 610 and the floating gate electrode 612 (FGl) of the EEPROM-NMOS transistor. In other: words, the potential at the floating gate electrode 612 is always about 3 volts less than the potential at the gate terminal 614.

When reading out a bit from the memory cell 600, approximately an NMOS threshold voltage is applied to the erase line 672 (erase_pin). As the control line 674 (WorE) is further at 0 volts during readout, the gate terminal of the first high voltage NMOS transistor 624 is at the supply voltage VDDD of the CMOS circuit part. Thus, the first high voltage NMOS transistor 624 is conductive. Thus, for all memory cells, the gate terminal 614 of the EEPROM-NMOS transistor 610 is at the potential of a threshold voltage. In other words, the EEPROM-NMOS transistor 610 is driven so that, between its gate terminal 614 and its source terminal, a voltage drops that is approximately equal to its idle threshold voltage that results when no charge is present on the floating gate electrode. If a logical "1" was stored into the EEPROM-NMOS transistor 610, the floating gate electrode 612, as derived above, is at a lower potential than the gate terminal 614. Thus, the EEPROM-NMOS transistor 610 blocks when a voltage is present between the gate terminal 614 and its source terminal that is approximately equal to the idle threshold voltage without charge on the launching capacitor. When reading out, there is further a high logical level (short: sel_eeprom= high) on a selection line 678 (also referred to as sel_eeprom), so that the second high voltage NMOS transistor 640, whose gate terminal is coupled to the selection line 678, is conductive. A potential below the supply voltage VDDD for the CMOS circuit part by about a threshold voltage of the second PMOS transistor 644 is further supplied to the second PMOS transistor 644 via a drive line 680. In other words, the potential at the gate terminal of the second PMOS transistor 644 has approximately the value VDDD−|Vth, p|, wherein Vth,p indicates the threshold voltage of the second PMOS transistor 644. Thus, the supply voltage VDDD reduced by the PMOS threshold voltage is present at the second PMOS transistor 644. Thus, the second PMOS transistor 644 acts like a current, source impressing a small current of about 0.5 microampere to 5 microampere into a circuit node 684 also referred to as bit1. Besides, the circuit node 684 is coupled to the drain terminal of the EEPROM-NMOS transistor 610 via the conductive second high voltage NMOS transistor 640. However, since the EEPROM-NMOS transistor 610 blocks in the above case, the current supplied by the second PMOS transistor 644 charges the circuit node 684 to about the supply potential VDDD of the CMOS circuit part. The circuit node 684 thus represents a high logic level, which is also referred to and/or interpreted as logical "1" or as "HIGH level". The switch and/or multiplexer 642 connected to an input of the EEPROM input/output register cell 650 is then switched to a position referred to as sel_eeprom_i. Thus, the circuit node 684 is switched to the input 690 of the EEPROM input/output register cell 650. There is further generated an impulse on a clock line 692, which is also referred to as clk_i, which takes and/or latches the logical state at the input 690 into a register of the EEPROM input/output register cell 650.

If the respective memory cell 600 is addressed, a switch 694, also referred to as EnableParOut_i is closed, thus putting an output 696 of the EEPROM input/output register cell 650 onto a column data line 698, also referred to as bitpar_io (cf. FIG. 5: bitpar_io<15:0>)).

The column data line 698 extends vertically, that is column-wise, across all EEPROM rows and passes the read-out bit to the output of the EEPROM, where it is available for a digital part of an integrated circuit including the described EEPROM.

The following describes the programming of a logical "0" into the shown memory cell 600. When programming a logical "0", the output 696 (bit_ser_o) is at a low logic level (bit_ser_o=0). Thus, the data line 634 is at a potential that is approximately equal to the supply potential VDDD of the CMOS circuit part. In other words, bit_n= VDDD. Thus, the gate terminal of the first high voltage NMOS transistor 624 is changed to a potential (VDDD−Vth,n) that is below the supply voltage VDDD of the CMOS circuit part by about a threshold voltage Vth,n of an NMOS transistor. Thus, the first high voltage NMOS transistor 624 is conductive, whereby a low potential of about 0 volts is present at the gate terminal 614 of the EEPROM-NMOS transistor 610. In other words, CG1= 0 volts. At the same time, when writing a logical "0", the erase line 672 is pulled to a high voltage of, for example, about 20 volts (erase_pin −20 volts). Thus, the full programming voltage with the inverse sign falls to the EEPROM-NMOS transistor 610 (also shortly referred to as "cell") as compared to the programming of a logical "1". Thus, electrons are sucked from the floating gate electrode 612. Thus, a differential voltage is created between the gate terminal 614 of the EEPROM-NMOS transistor 610 and the associated floating gate electrode 612, whose sign is opposite to that for programming a logical "1". In this case, the floating gate electrode 612 is thus always more positive than the gate terminal 614, for example by about 3 volts.

During readout of the EEPROM cell 600, performed as described above, the EEPROM-NMOS transistor 610 is thus conductive. Thus, the circuit node 684 is pulled to a low potential (bit= 0 volts). Thus, a low logic level, also referred to as logical "0" or "low level", is taken and/or latched into the register of the EEPROM input/output register cell 650.

The bits of several or all memory cells 600 of an EEPROM may further be XOR-ed column-wise, for example, to thus be able to execute a matrix parity check. This task may be done by the shown XOR gate 660.

In the EEPROM cell 600, which is able to store one bit and which is thus also referred to as bit cell, the parts with the highest chip area consumption are the three high voltage MOS transistors 622, 624, 640, the EEPROM-NMOS transistor 610 including launching capacitor as well as the EEPROM input/output register cell 650 including additional standard CMOS gates. Furthermore, all shown means have to be repeated for each further cell in the shown architecture 600 of the EEPROM bit cell. When a plurality of EEPROM bit cells 600 is present, this results in very high area requirements.

SUMMARY

In an embodiment, a memory circuit may comprise a first non-volatile memory transistor with a floating gate electrode and a gate terminal; and a second non-volatile memory transistor with a floating gate electrode and a gate terminal; a first switch connected between a drain terminal of the first memory transistor and a bit line for reading out information stored in the memory circuit; a second switch connected between a drain terminal of the second memory transistor and the bit line, wherein the first switch and the second switch are formed to selectively couple the drain terminal of the first memory transistor or the drain terminal of the second memory transistor to the bit line during readout; and a drive circuit formed to write data into one of the memory transistors in write operation, wherein the drive circuit is formed to apply equal signals to the gate terminals of the first memory transistor and the second memory transistor based on the write data; to apply a programming signal at a source terminal of the memory transistor to be written to, which allows to change a state stored in the memory transistor to be written to; and to drive a source terminal of a memory transistor not to be written to such that a state stored in the memory transistor not to be written to is not changed.

BRIEF DESCRIPTION OF THE DRAWINGS

Embodiments of the present invention will be explained in more detail below with respect to the accompanying drawings, in which:

FIG. 2b is a graphical representation of exemplary timings in the operation of a memory circuit, according to the second embodiment;

FIG. 4 shows a flow chart of a method according to a sixth embodiment;

FIG. 5 shows a block circuit diagram of a known conventional EEPROM architecture.

DETAILED DESCRIPTION

Figure 1:
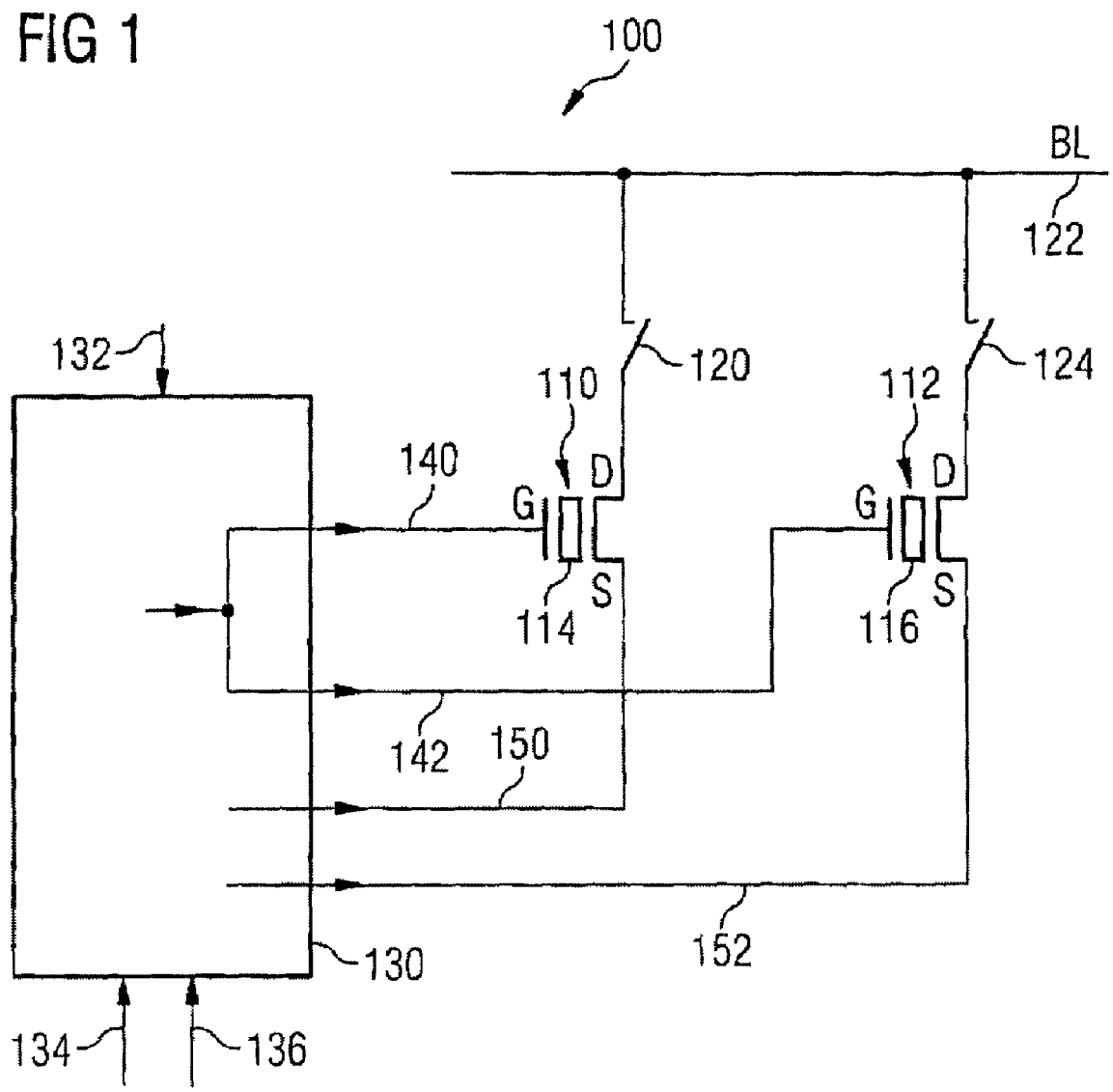
FIG. 1 shows a circuit diagram of a memory circuit according to a first embodiment.

According to an embodiment, a memory circuit may have a first non-volatile memory transistor with an associated floating gate electrode and a gate terminal and a second non-volatile memory transistor with an associated floating gate electrode and a gate terminal. The memory circuit further may include a first switch connected between a drain terminal of the first memory transistor and a bit line for reading out information stored in the memory circuit, and a second switch connected between a drain terminal of the second memory transistor and the bit line. The memory circuit may further include a drive circuit designed to write write data into one of the memory transistors in write operation. In an embodiment, the drive circuit is designed to apply equal signals to the gate terminals of the first memory transistor and the second memory transistor based on the write data, to apply a programming signal to a source terminal of the memory transistor to be written to, which allows to change a state stored in the memory transistor to be written to, and to drive a source terminal of a memory transistor not to be written to such that, a state stored in the memory transistor not to be written to is not changed.

It is may be particularly advantageous to drive several memory transistors for non-volatile storage of information when writing in information at the gate terminals with the same signals, and further to determine, in a write operation, by suitable driving of the source terminals the state of which one of the two transistors is changed, whereas the transistor to be read, out is selected, when reading out, by coupling a drain terminal of the memory transistor to be read out to the bit line via a switch.

It has been shown that the switching effort may be drastically reduced in connection with an EEPROM structure, if the same gate drive circuit drives two or more memory transistors at the same time. In order to ensure in this case that memory transistors may be programmed independent of each other with the same gate driving, the source terminals of the memory transistors are driven separately, because states stored in the memory transistors may be determined and/or changed by the voltage present, between the gate terminal and the source terminal, respectively.

In an embodiment, two switches can be provided for reading out the memory transistors, the first one of which is connected between the drain terminal of the first memory transistor and the bit line, and the second one of which is connected between the drain terminal of the second memory transistor and the bit line. According to an embodiment, a selection of a memory transistor to be read out is made by a switch between the drain terminal of the transistor to be read out and the bit line, while a selection of a memory transistor to be written to is made by suitable driving of the associated source terminal.

Thus, the memory circuit combines two different selection mechanisms for the memory transistor to be read out or written to. It is achieved that the bit line, which is connectable to drain terminals of several memory transistors via the first, switch and the second switch, is decoupled from the high voltages occurring during writing during the write operation by an opened first switch and an opened second switch. The bit line is directly connected to a low voltage CMOS circuit, which is not able to tolerate a high (programming) voltage occurring when writing to the memory transistor. The high voltage necessary for writing is instead supplied to the memory transistor via the gate terminal and/or the source terminal, depending on whether a logical "0" or a logical "1" is to be written. The source terminal of a memory transistor not to be written to, however, is driven suitably to change a change of the state stored in the memory transistor not to be written to.

The memory circuit allows a resource-efficient realization, because the particularly complicated drive circuit for generating the signals at the gate terminals of the first memory transistor and the second memory transistor only has to be implemented once. This allows to achieve doubling of the memory capacity as compared to conventional comparable memory circuits, wherein an area requirement only increases by a factor of about 1.3. However, drive circuits for the source terminals of the memory transistors are realizable with little effort on the one hand and may, on the other hand, be reused for a plurality of memory transistors when using a larger memory circuit with more than two memory transistors.

In an embodiment, the memory circuit may thus also constitute a basic circuit for a resource-efficient realization of a significantly larger memory arrangement composed of a plurality of basic circuits. Furthermore, the memory circuit allows an advantageous coupling of the readout circuit via the bit line, wherein the memory transistors are decoupled from the bit line via the first switch and the second switch in a write operation, and wherein further a memory transistor to be read out from the first memory transistor and the second memory transistor may be coupled to the bit line in read operation via the associated switch from the first switch and the second switch.

In an embodiment, in readout operation, equal signals may again be present, at the gate terminals of the two memory transistors. In an embodiment, equal signals may also be present at the source terminals in readout operation due to the presence of the first switch and the second switch. This is particularly advantageous because the generation of different signals at the source terminals of the two memory transistors in read operation would result in significant effort. Furthermore, it has been found that a selection of a memory transistor via a switch between the drain terminal of the memory transistor and the bit line may be made significantly faster than in the case where source potentials of several memory transistors would have to be changed for the selection of a memory transistor to be read out. The memory circuit thus comprises both less area requirements and increased speed in readout operation as compared to conventional comparable memory circuits.

In a further embodiment, the drive circuit is designed to apply a first potential at the gate terminals of the memory transistors in write operation, to apply a programming signal with a second potential at the source terminal of the memory transistor to be written to, and to apply a third potential at the source terminal of the memory transistor not to be written to. In an embodiment, the drive circuit is further preferably designed to set the applied potentials, when writing a first data value, also referred to as logic HIGH level and/or logical "1", such that the second potential is lower than the first potential and that the third potential differs less from the first potential in magnitude than the second potential. When writing a second data value, which is also referred to as logic LOW level and/or logical "0", the drive circuit sets the applied potentials such that the second potential is higher than the first potential, and that the third potential differs less from the first potential than the second potential.

Thus, the memory circuit is capable of writing to only exactly one of the two memory transistors in a particularly advantageous manner. The state stored in the memory transistors is determined by the associated charge present on the floating gate electrode of the respective memory transistor. This charge is in turn changed due to tunneling of charge carriers through a gate isolator of the respective memory transistor. The strength of the tunneling depends on a potential difference across the gate isolator of the respective memory transistor and becomes stronger as the potential difference becomes larger. If, for example, the potential difference between the first potential and the third potential is less than the potential difference between the first, potential and the second potential, tunneling of charge carriers to the floating gate electrode of the memory-transistor to be written to occurs, whereas no tunneling (and/or only significantly less tunneling) of charge carriers to the floating gate electrode of the memory transistor not to be written to occurs. Tunneling of charge carriers to the floating gate electrode of the memory transistor not to be written to is significantly less than for the memory transistor to be written to due to the smaller potential difference in magnitude present at the gate source path of the memory transistor not to be written to. Thus, while the state of the memory transistor to be written to is changed and/or may be changed, the state of the memory transistor not to be written to is maintained unchanged. Furthermore, the polarity of the potentials determines whether a logical "1" or a logical "0" is stored into the memory transistor to be written to.

In a further embodiment, the drive circuit includes a gate drive circuit and a source drive circuit, wherein the source drive circuit drives the terminals independent of the data value to be written. When a data value is written, the gate drive circuit, however, applies a first gate write potential or a second gate write potential at the gate terminals of the memory transistors depending on the data value to be written. During writing, the source drive circuit further drives the source terminal of the memory transistor not to be written to so that a third potential is present at the source terminal of the memory transistor not to be written to, so that a state stored in the memory transistor not to be written to remains unchanged independent of the gate write potential. In an embodiment, the source drive circuit is further designed to apply a second potential at the source terminal of the memory transistor to be written to in a first phase, the potential being selected so that a state stored in the memory transistor to be written to may be changed (i.e. is changed if a change is required), when the first gate write potential is present, and that a state stored in the memory transistor to be written to remains unchanged, when the second gate write potential is present. In an embodiment, the source drive circuit is further designed to apply a fourth potential, to the source terminal of the memory transistor to be written to in a second phase, the potential being selected so that a state stored in the memory transistor to be written to may be changed, when the second gate write potential is present, and that a state stored in the memory transistor to be written to remains unchanged, when the first gate write potential is present.

The described implementation of the control circuit may achieve that the waveforms generated by the source drive circuit are independent of the data value to be written. In an embodiment, the third potential applied at the source terminal of the memory transistor not to be written to may be selected so that, the state of the memory transistor not to be written to remains unchanged independent of the write potential present at the gate terminals. The third potential may, for example, be between the first gate write potential and the second gate write potential.

In an embodiment, a data value associated with the first gate write potential (for example logical "1") is further stored in the memory transistor to be written to in the first phase, while in the second phase there is then no change. When writing in a second data value (for example logical "0"), with which the second gate write potential is associated, no change of the state stored in the memory transistor to be written to will occur in the first phase, while the state stored in the memory transistor is set in the second phase. In other words, the change of the state of the memory transistor to be written to occurs in the first phase or in the second phase depending on whether the first data value or the second data value is stored.

In an embodiment, the source drive signals pass the two phases independent of the data value to be written, whereby only the gate drive circuit is still dependent on the data value to be written. Besides, in an embodiment, the source drive signals may be used for simultaneous driving and/or simultaneous writing of different data values to several memory transistors. For this purpose, only different gate drive circuits have to be provided for several memory transistors to be written to, while the source drive circuit may be used commonly by the several memory transistors to which different data values are to be written. Thus, the complexity of a memory circuit with several memory transistors to be written to simultaneously may be significantly reduced.

According to different embodiments, a drive circuit for driving a memory and a method for writing write data into a memory transistor in a memory circuit are provided.

Furthermore, a drive circuit for driving a memory and a method for writing write data into a memory are provided.

FIG. 1 shows a circuit diagram of an embodiment of a memory circuit. The memory circuit, of FIG. 1 is designated 100 in its entirety. The memory circuit 100 includes a first memory transistor 110 and a second memory transistor 112. The memory transistors 110, 112 serve for non-volatile storing of information and respectively, include an associated floating gate 114, 116. What is meant by non-volatile storing is that, information stored in the memory transistors 110, 112 is preserved even if operational voltages of the memory circuit 100 are turned off. The floating gate electrode 114 of the first memory transistor 110 and the floating gate electrode 116 of the second memory transistor 112 are typically electrically isolated from a gate terminal and a channel area of the respective transistor by a gate isolation.

A drain terminal of the first memory transistor 110 is connected to a bit line 122 via a first, switch 120. A drain terminal of the second memory transistor 112 is connected to the bit line 122 via a second switch 124. Preferably, the drain terminals of the memory transistors 110, 112 are directly connected to the bit line via the switches 120, 124, so that no further switches are connected, between the drain terminal and the bit line 122.

An embodiment of a memory circuit 100 further includes a drive circuit 130. It is designed to receive write data 132 and address information 134. The drive circuit 130 may further optionally receive a write signal 136 indicating that write data 132 are to be written into one of the memory transistors 110, 112.

The drive circuit 130 is designed to apply the same control signals 140, 142 to the gate terminals of the first memory transistor 110 and the second memory transistor 112 in write operation, which may, for example, be initiated by the write signal 136. The control signals 140, 142 depend on the write data 132. Furthermore, the drive circuit is designed to apply a programming signal to a source terminal of a memory transistor to be written to of the first memory transistor and the second memory transistor in the write operation. Here, the drive circuit 130 may use the address information 134 to determine whether the first memory transistor 110 or the second memory transistor 112 is to be written to. A signal is applied to the source terminal of the memory transistor 110 to be written to, which allows to change a state stored in the memory transistor to be written to. Furthermore, the drive circuit 130 is designed to drive a source terminal of a memory transistor not to be written to of the first memory transistor and the second memory transistor such that a state stored in the memory transistor not to be written to is not changed independent of the data-dependent control signals 140, 142 present at the gate terminals of the memory transistors 110, 112. For example, the drive circuit 130 may impress a predetermined potential to the source terminal of the memory transistor not to be written to. Alternatively, the drive circuit 130 may also let the source terminal of the memory transistor not to be written to float.

Figure 2A:
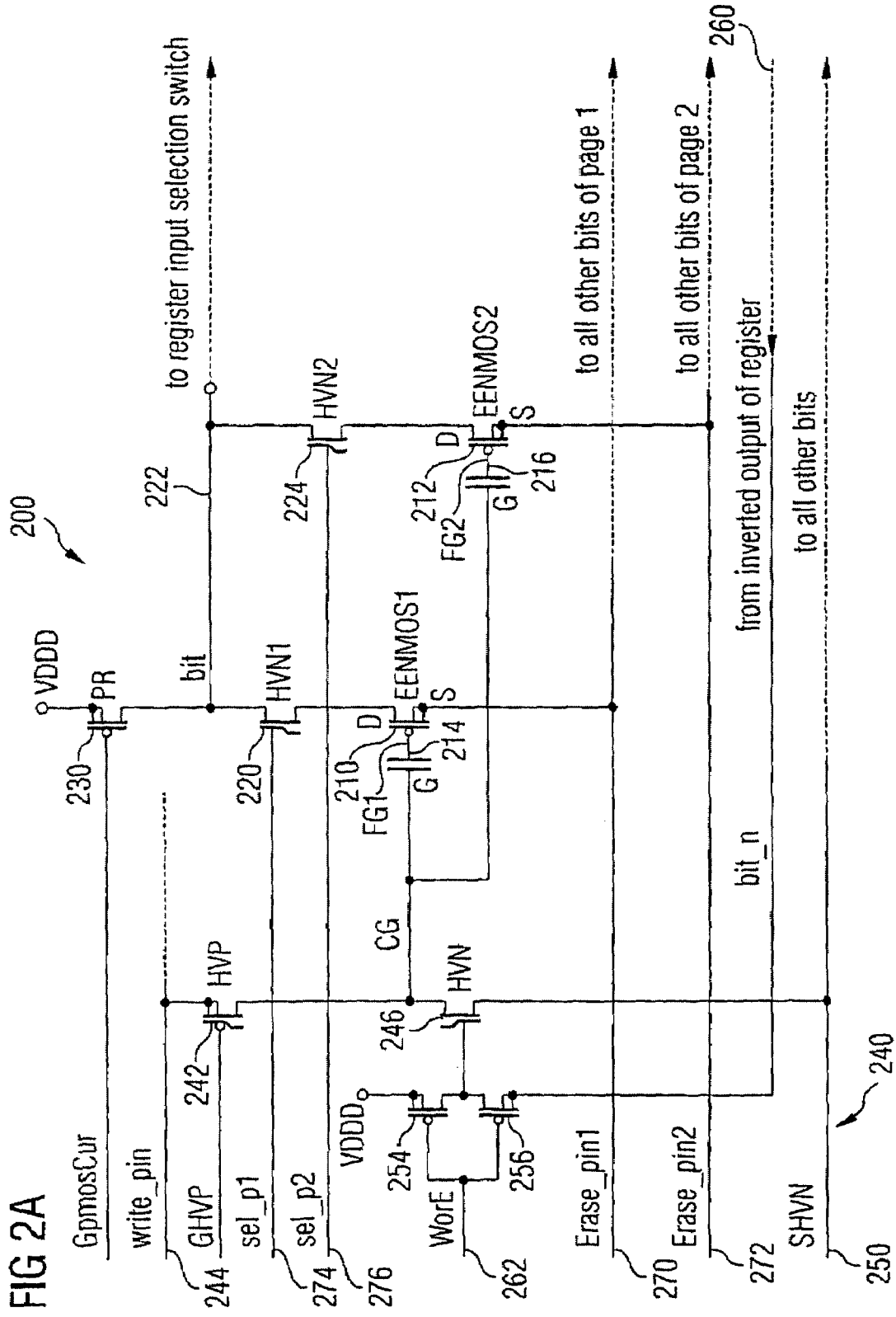
FIG. 2a shows a circuit diagram of a memory circuit according to a second embodiment.

FIG. 2a shows a circuit diagram of an embodiment of a memory circuit of FIG. 1. The memory circuit of FIG. 2a is designated 200 in its entirety. The memory circuit 200 includes a first EEPROM-NMOS transistor 210, also referred to as first memory transistor. The memory circuit 200 further includes a second EEPROM-NMOS transistor 212, also referred to as second memory transistor. The first, memory transistor 210 comprises a floating (i.e. electrically non-connected) gate electrode 214, to which an electric charge may be applied. The electric charge applied to the floating gate electrode 214 of the first memory transistor 210 has an influence on a threshold voltage of the first memory transistor 210, wherein the threshold voltage defines a gate source voltage of the first memory transistor 210, at which the first memory transistor 210 passes from a non-conductive state to a conductive state. Analogously, the second memory transistor 212 also comprises a floating gate electrode 216. A drain terminal of the first memory transistor 210 is connected to a bit line 222 via a first high voltage NMOS transistor 220. Furthermore, a drain terminal of the second memory transistor 212 is connected to the bit line 222 via a high voltage NMOS field effect, transistor 224. The bit line 222 is further connected to a positive supply potential VDDD via a PMOS field effect transistor 230. The positive supply potential VDDD further supplies a CMOS circuit connected to the bit line 222. Gate terminals of the first memory transistor 210 and the second memory transistor 212 are coupled to each other and connected to a gate drive circuit 240.

The gate drive circuit 240 includes a first high voltage PMOS field effect transistor 242 connected between a write voltage terminal 244 (also referred to as write_pin) and the gate terminals of the first memory transistor 210 or the second memory transistor 212, respectively. Furthermore, a third high voltage NMOS field effect transistor 246 is connected between the gate terminals of the memory transistors 210, 212 and a low potential 250 (also referred to as SHVN). In other words, a source terminal of the first high voltage PMOS field effect transistor 242 is coupled to the write voltage terminal 244, and a source terminal of the third high voltage NMOS field effect transistor 246 is coupled to the low potential 250. Drain terminals of the first high voltage PMOS field effect transistor 242 and the third high voltage NMOS field effect transistor 246 are coupled to each other and to the gate terminals of the memory transistors 210, 212.

A gate terminal of the third high voltage NMOS field effect transistor 210 is coupled to the supply potential VDDD of a CMOS circuit part via a channel path of a low voltage PMOS field effect transistor 254. The gate terminal of the third high voltage NMOS field effect transistor 246 is further coupled to a write data input 260 via a channel path of a low voltage NMOS field effect transistor 256. Gate terminals of the low voltage PMOS field effect transistor 254 and the low voltage NMOS field effect transistor 256 are coupled to each other and to a write signal input 262. The write data input 260 is further connected, for example, to an inverted output of a register not shown here. It is to be noted that a high potential close to the supply potential VDDD is preferably present at the write data input 260, while a logical "0" is to be stored in the memory circuit 200. On the other hand, a low potential close to a reference potential GND (also defined with 0 volts) is preferably present at the write data input 260, when a logical "1" is to be stored in the memory circuit 200.

The gate drive circuit 240 now operates such that a potential close to the low potential 250 is present at the gate terminals of the memory transistors 210, 212, as long as the write control signal 262 is inactive, i.e. has a level close to the reference potential.

In write operation, however, a signal depending on the data present at the write data input 260 is present at the gate terminals of the memory transistors 210, 212. If a low logic level close to the reference potential is present at the write data input 260, it is passed on by the low voltage NMOS field effect transistor 256, if the write signal 262 is active. Thus the third high voltage NMOS field effect transistor 246 is put into a non-conductive state. By the first high voltage PMOS field effect transistor 242 acting as current source, the gate terminals of the memory transistors 210, 212 are then pulled to a high level close, to the potential present at the write voltage terminal 244. The precondition is, of course, that a potential is present at the gate terminal of the first high voltage PMOS field effect transistor 242 in write operation that is below the potential present at the write voltage terminal 244 by about 1-2 volts. The first high voltage PMOS field effect, transistor 242 thus serves as current source and current-limiting element, when a high potential based on a potential present at the write voltage terminal 244 is supplied to the gate terminals of the memory transistors 210, 212.

If there is further a high potential at the write data input 260, the third high voltage NMOS field effect transistor 246 has a low-resistance conductive channel (source drain path) and thereby pulls the potential at the gate terminals of the memory transistors 210, 212 to a potential, close to the low potential 250.

Thus, the gate drive circuit fulfills the function to provide a defined potential at the gate terminals of the memory transistors 210, 212 in read operation. However, in write operation, the gate drive circuit provides a data-dependent potential at the gate terminals of the two memory transistors 210, 212, wherein a potential close to the potential present at the write voltage terminal 244 is supplied at the gate terminals of the memory transistors 210, 212 when writing a logical "1", and wherein a low potential close to the low potential 250 is present at the gate terminals of the memory transistors 210, 212 when writing a logical "0".

The following will briefly summarize the essential processes when programming data into the first memory transistor 210 or the second memory transistor 212. For better understanding, see also the description of FIG. 6, which shows an EEPROM input/output register cell 650, which may also be used in connection with an embodiment of the memory circuit 200. It is further to be noted that the first memory transistor 210 is associated with a first memory page by definition, while the second memory transistor 212 is associated with a second memory page. The memory pages are designated by addresses and may, for example, also correspond to the memory rows 530 shown in FIG. 5. A memory page may, however, also be selected independent of the memory rows, so that, for example, two memory pages are associated with each memory row 530.

If a logical "1" is written into the first page of the memory circuit 200, this logical "1" is first loaded into a corresponding register cell, not shown in FIG. 2a. The inverted output signal of the register cell is then supplied to the write data input designated 260. Thus, if a logical "1" is to be written, a low logic level is present at the write data input 260. In that way, the third high voltage NMOS field effect transistor 246 blocks, and the gate terminals of the memory transistors 210, 212 (also referred to as CG) are pulled up to, for example, 20 volts by the high voltage PMOS field effect transistor 242. Since it is now desired to apply charge only to the floating gate electrode 214 of the first memory transistor 210, but not to the floating gate electrode 216 of the second memory transistor 212, only the source terminal of the first memory transistor 210 coupled to the first erase terminal 270 (also referred to as erase_pin1) may be at 0 volts. The second erase terminal 272 (also referred to as erase_pin2) coupled to the source terminal of the second memory transistor 212, however, must be at a higher voltage, so that there is no reprograinming of the charges on the floating gate electrode 216 of the second memory transistor 212.

In practice, the second erase terminal 272 could, for example, be at a potential of 20 volts (with respect to the reference potential). However, in most cases it is better if the floating gate electrode 216 of the second memory transistor 212 and/or the second erase terminal 272 is at about half of this, i.e. at about 10 volts. In other words, it is preferred to put the second erase terminal 272 to a potential that is approximately in the middle between the potentials occurring at the first memory transistor 210 in the extreme case. Thus only half the blocking voltages between the first and second memory transistors 210, 212, which are located close to each other, are generated. If a higher blocking voltage were present between the closely adjacent memory transistors 210, 212, the memory transistors 210, 212 would have to be designed for higher electric strength. If, however, electric strength between the adjacent memory transistors 210, 212 or between two other drive transistors had to be increased, their distances would have to be increased, which in turn requires more chip area.

What is particularly important is the reduction of the maximally occurring blocking voltage when it is so large that the two memory transistors 210, 212 have to be in different n-wells to prevent breakdown. In this case, again a lot of additional space would be lost by the contacting of the above-mentioned wells, reducing the area gain discussed above. For this reason, it is recommended to apply approximately half the programming voltage to the erase voltage lines (erase_pin lines) of the pages that are not to be reprogrammed. This allows to minimize the voltage requirements for lateral breakdowns of adjacent memory transistors 210, 212. In other words, a voltage is preferably applied to the erase terminal 272 of the memory transistor 212 not to be reprogrammed that is approximately in the middle between the low potential 250 and the potential present at the write voltage terminal 244. In other words, the potential, present at the erase terminal 272 of the memory transistor 212 not to be reprogrammed is preferably selected between the potentials that may maximally be applied to the memory transistor 210 to be programmed.

It is further to be noted that the memory transistors 210, 212 may also be referred to as EENMOS transistors.

Similarly to what was described above, what applies, for example, to the programming of a logical "0" to a second page of the memory circuit 200 is that a potential of, for example, 0 volts is present at the gate terminals of the memory transistors 210, 212, i.e. at the point designated CG. Only the second erase terminal 272 (erase_pin2) may then be at a potential of 20 volts, whereas the first erase terminal 272 (erase_pin2) is preferably at a potential of 10 volts or less.

The following describes how the circuit may be designed to program several memory transistors simultaneously with different data values without requiring separate source drive circuits for this purpose.

For this purpose, FIG. 2b shows a graphical representation of exemplary timings in the operation of a memory circuit 200 according to the second embodiment. The graphical representation of FIG. 2b is designated 280 in its entirety. The graphical representation 280 shows timings during programming of the first memory transistor to the logical value "1" and to the logical value "0", respectively.

A first graphical representation 282 describes a voltage behavior at the gate terminals of the memory transistors 210, 212, when: writing a logical "1" into the first memory transistor 210. A second graphical representation 284 shows a potential behavior at the source terminal of the first memory transistor 210 during the above-mentioned write process, and a third graphical representation 286 shows a potential behavior at the source terminal of the second memory transistor 212. Prior to a first time t1, the potential at the gate terminals of the memory transistors 210, 212 assumes an idle value. The potentials at the source terminals of the memory transistors 210, 212 are also at idle values.

At a time t1, now initiate a write process for writing a logical "1" into the first memory transistor 210. Subsequently, the drive circuit 230 causes the potential at the gate terminals of the memory transistors 210, 212 to be driven to a value of, for example, 20 volts and/or to a first gate write potential. For example, the first high voltage PMOS field effect transistor 242 in connection with the associated drive signals is responsible for this. At the same time, a potential at the source terminal of the first memory transistor 210 is also driven up to a value of about 20 volts, which is independent of the present write data and which is also referred to as second potential. A potential at the source terminal of the second memory transistor 212 is further driven up to, for example, 10 volts and/or to a third potential. The above final values for the three potentials are reached, for example, at time t2 and maintained until a third time t3.

A potential difference between a gate terminal of the first memory transistor 210 and the source terminal of the first memory transistor 210 is very little and may be assumed to be zero. A potential difference between the gate terminal of the second memory transistor and the source terminal of the second memory transistor 212, however, is about +10 volts. The gate-source potential difference at the second memory transistor 212, however, is not sufficient to change a state stored in the second memory transistor 212. A gate-source potential difference of 10 volts is not sufficient for the occurrence of Fowler-Nordheim tunneling through a gate isolator of the second memory transistor 212.

Between the third time t3 and a fourth time t4, the potentials at the gate terminals of the memory transistors and at the source terminals of the memory transistors 210, 212 are optionally driven back to respective idle values and maintained at the idle values until a fifth time t5. Between the fifth time t5 and a sixth time t6, the potential at the gate terminals of the memory transistors 210, 212 is again raised to the same value that was already supplied to the gate terminals between the second time t2 and the third time t3. However, a potential at the source terminal of the first memory transistor 210 remains at a low value after the sixth time t6, for example at the associated idle value of about 0 volts, and/or is put to a fourth potential. This creates a large gate-source potential difference between the gate terminal of the first memory transistor 210 and the source terminal of the first, memory transistor 210. Thus, electrons may tunnel from the channel area of the first memory transistor 210 to the floating gate electrode of the first memory transistor 210. The floating gate electrode of the first memory transistor 210 is thus negatively charged, thus changing a threshold voltage and/or starting voltage of the first memory transistor 210. Thus, the state associated with the logical value of "1" is stored in the first memory transistor 210. The source terminal of the second memory transistor 210, however, is at a potential of, for example, about 10 volts from the sixth time to. This potential may be equal to the second potential assumed by the source terminal of the second memory transistor 212 between the second time t2 and the third time t3 or may differ therefrom. In the shown example, a gate-source potential difference at the second memory transistor 212 is again about +10 volts following the sixth time to. A potential difference of about 10 volts, however, is again not sufficient to cause a sufficiently strong Fowler-Nordheim tunneling, so that, as desired, the charge stored on the floating gate electrode of the second memory transistor 212 and consequently the state stored by the second memory transistor 212 is maintained unchanged. Following the seventh time t7, the gate potentials of the memory transistors 210, 212 and the source potentials of the memory transistors 210, 212 are again driven back to idle values.

It is to be noted that, for the storage of a logical "1" in the first memory transistor, only the phase between the sixth time t6 and the seventh time t7 is relevant. Therefore, the timing for the programming of a logical "1" into the first memory transistor 210 may only include the above waveform between the sixth time t6 and the seventh time t7. For example, the timings between the first time t1 and the fourth time t4 may be omitted when programming a logical "1".

A fourth graphical representation 288 further shows a timing of the potentials at the gate terminals of the first memory transistor 210 and the second memory transistor 212, if a logical "0" is stored into the first memory transistor 210. In this case, the timings shown in the second graphical representation 284 and the third graphical representation 286 at the source terminal of the first, memory transistor 210 and the second memory transistor 212 may remain unchanged.

When programming a logical "0", the potential, at the gate terminals of the memory transistors 210, 212 drops, for example, from an idle value to a low value, for example to 0 volts, at the first time t1 and remains at this value, which is also referred to as second gate write potential, until the third time t3. Between the third time t3 and the fourth time t4, the potential at the gate terminals of the memory transistors 210, 212 may again return to an idle value, at which the gate potential may remain until the fifth time t5. Between the fifth time t5 and the sixth time t6, the gate potential may again drop to the low value of, for example, 0 volts, when programming a logical "0", where it then preferably remains until the seventh time t7.

Between the second time t2 and the third time t3, there is thus a gate-source potential, difference of −20 volts at the first memory transistor 210. Due to the thus caused high field strength in the gate isolator of the first memory transistor 210, this magnitude-wise high potential difference results in electrons being sucked from the floating gate electrode of the first memory transistor 210 into the channel area of the first memory transistor 210. The charge on the floating gate electrode of the first memory transistor 210 is thus changed, corresponding to a change of the state stored in the first memory transistor 210. A gate-source potential difference at the second memory transistor 212, however, is, for example, about −10 volts between the second time t2 and the third time t3, which is not sufficient for the occurrence of noticeable tunneling of charge carriers through the gate isolator of the second memory transistor 212. The state stored in the second memory transistor 212 is thus maintained unchanged.

Between the sixth time t6 and the seventh time t7, a gate-source potential difference at the first memory transistor 210, however, is 0 volts, so that the state of the first memory transistor 210 set between, the second time t2 and the third time t3 is maintained unchanged. Similarly, the state stored in the second memory transistor 212 is maintained unchanged between the sixth time t6 and the seventh time t7 due to the comparably low gate-source potential difference of only about −10 volts.

It is to be noted again that, for storing a logical "0" into the first memory transistor 210, only the timings between the second time t2 and third time t3 are relevant, so that the other timings may be changed or omitted. However, it is to be noted that the timings shown in the second graphical representation 284 and the third graphical representation 286 may ensure that a state of the first memory transistor 210 may always be set correctly independent of the data to be stored, i.e. independent of whether the timing shown in the first graphical representation 282 or the timing shown in the fourth graphical representation 288 is present at the gate terminals.

It is further to be noted that the second memory transistor 212 may be programmed by exchanging the waveform present at the source terminal of the first memory transistor 210 and the waveform present at the source terminal of the second memory transistor 212. It is thus a task of the drive circuit 130 to select, depending on the address information 134, at which one of the memory transistors 110, 112, 210, 212 the waveform shown in the second graphical representation 284 or the waveform shown in the third graphical representation 286 is present.

In general, it is preferred that a potential difference between the first gate write potential and the second potential is larger in magnitude by at least 3 volts than a potential difference between the first gate write potential and the third potential, and that a potential difference between the second gate write potential and the fourth potential is larger in magnitude by at least 3 volts than a potential difference between the second gate write potential and the third potential. As the strength of the (Fowler-Nordheim) tunnel depends on the corresponding gate-source voltage in an approximately exponential way, the gate-source potential difference at the second memory transistor not to be written to must, be significantly smaller in magnitude than the gate-source potential difference at the first memory transistor to be written to. It has been shown that, a difference of the gate-source potential differences of at least 3 volts is sufficient, wherein, of course, a difference of the potential differences of at least 5 volts has even better results. The above voltages apply to tunnel oxide thicknesses (of the non-volatile memory transistors) of 16 nm. In the case of half the thickness of the tunnel oxide, the above voltages also have to be about halved.

Furthermore, it is to be noted that the potential difference between the first gate write potential and the second gate write potential is preferably between 12 volts and 50 volts.

Furthermore, the third potential is preferably between the second gate write potential and the first gate write potential, wherein:

$$V_{S2}+0.3(V_{S1}-V_{S2}) \leq V_3 \leq V_{S2}+0.7(V_{S1}-V_{S2}),$$

wherein $V_{S1}$ indicates the first gate write potential, wherein $V_{S2}$ indicates the second gate write potential, and wherein $V_3$ indicates the third potential.

Furthermore, the following preferably applies to the second potential $V_2$:

$$V_2 < V_{S2}+0.2(V_{S1}-V_{S2}),$$

wherein $V_{S2}$ indicates the second potential. Similarly, the following preferably applies to the fourth potential $V_4$:

$$V_4 > V_{S2}+0.8(V_{S1}-V_{S2})$$

The above-described relations may achieve that a reliable programming of the memory transistor to be written to is performed, whereas the state of the memory transistor not to be written to remains unchanged. Furthermore, this guarantees that the third potential is in an advantageous range between the first gate write potential and the second gate write potential. This keeps the overall potential differences occurring in the circuit as low as possible.

Furthermore, the potential difference between the first gate write potential and the second potential is preferably larger than 12 volts in magnitude. Likewise, the potential difference between the second gate write potential and the third potential is larger than 12 volts in magnitude. This ensures that a charge on the floating gate of the memory transistor to be written to may be reliably changed.

Furthermore, it is preferred that the potential difference between the first gate write potential and the third gate write potential is smaller than 12 volts in magnitude, because thus the gate-source potential difference of the memory transistor not to be written to is small enough to prevent a change of the state stored in the second memory transistor. Similarly, a potential difference between the second gate write potential and the third potential is preferably smaller than 12 volts in magnitude.

Furthermore, it is to be noted that, for example, in a first phase between the second time t2 and the third time t3, a gate-source potential difference is present, at the memory transistor not to be written to that is larger than a threshold voltage of the memory transistor not to be written to. Since the associated switch between the drain terminal of the memory transistor not to be written to and the bit line 122, 222 is, however, open, no current flows through the memory transistor not to be written to. Finally, it is to be noted that, a switch between the drain terminal of the memory transistor to be written to and the bit line 122, 222 is also open in the write operation, so that no drain current may flow through the memory transistor to be written to either. The change of the state stored in the memory transistors thus occurs without drain current flow only by tunneling of charge carriers through the gate isolator due to the potential difference between the gate terminal and the source terminal at the memory transistor to be written to.

Furthermore, it is to be noted that the drive circuit changes the potentials at the gate terminals and the source terminals of the transistors preferably in a ramp-shaped way, so that, a jump-like change of the potentials by more than 5 volts is avoided. This ensures that there is no high undesired change of a state stored in one of the memory transistors. In other words, the drive circuit is designed to change at least one of the potentials present at the memory transistors in a ramp-shaped course such that a jump-like change of a potential difference between two potentials present at the memory transistors by more than 5 volts is avoided.

The following will describe reading out the data from the memory circuit 200. It is to be noted that the readout of the data is performed in a similar way as in the memory circuit 600 described with respect to FIG. 6. A page to be read out from a plurality of pages to be read out may be selected by a first page selection signal 274 and a second page selection signal 276. The first page selection signal 274, which is also referred to as sel_p1, drives a gate terminal of the first high voltage NMOS field effect, transistor 220, while the second page selection signal 276 drives a gate terminal of the second high voltage NMOS field effect, transistor 224. The page selection signals 274, 276 (also referred to as sel_p1 and sel_p2) may thus be regarded as control lines whose state is set depending on address information 134. If the first page selection signal 274 is active, i.e. at a high logic level (sel_p1=HIGH), the second page selection signal 276 is preferably inactive (sel_p2=LOW). Thus the first page, i.e. a state stored in the first memory transistor 210 (EENMOS), is read out. The result of the readout, i.e. the state of the first memory transistor 210, is taken into the EEPROM input/output register cell 650 with the occurrence of a clock signal, also referred to as clk_i pulse with respect to FIG. 6. The input of the EEPROM register cell 650 is coupled to the bit line 222 via a multiplexer 642.

It is apparent from the shown representation that the EEPROM register cell 650, whose input is coupled to the bit line 222, contains only values of either page 1 (i.e. the first memory transistor 210) or page 2 (i.e. the second memory transistor 212) at a certain point in time. Thus, it is not possible to read out both pages (i.e. page 1 and page 2 and/or the state of the first memory transistor 210 and the state of the second memory transistor 212) simultaneously. This means that the data stored in the two pages are preferably distributed among the pages so that data required simultaneously are located on the same page. If this is not possible, the data of page 1 have to latched in a memory device of the integrated circuit containing the memory circuit 200, before page 2 (and/or the data of page 2 or the state of the second memory transistor 212) is taken and/or latched into the above EEPROM register cell, whose input is coupled to the bit line 222. It is to be noted here that the latching into the above EEPROM register and/or into the EEPROM register cell requires significantly more time than switching an addressed row (for example already designated 500 in FIG. 5) through to an input/output bus (IO bus) (that is for example to the parallel column data lines 540). Thus, an access to several pages significantly increases access time to the data.

Ideally, the data required most frequently should therefore be accommodated on the first page. On the further pages, there may then ideally be stored data that are required only rarely. For example, an identification code of a device and/or an integrated circuit, which is only interrogated by a system CPU during power on, could be stored on the second page.

Furthermore, it is possible to define access rights to different pages of the control circuit 200 differently. For example, page 1 may be reserved only for the user, while page 2 is reserved only for the semiconductor manufacturer. When the semiconductor manufacturer delivers an integrated circuit with a memory circuit 200, the semiconductor manufacturer disables, for example, a programming and/or reading possibility of page 2. It is further also conceivable that the above integrated circuit (IC) itself stores usage data on page 2 over its lifetime. For example, the integrated circuit may program a signature on page 2 when detecting overtemperature or overvoltage or another parameter outside specified limits (preferably these are maximally allowed parameters and/or maximum rating parameters), such as magnetic field, pressure or acceleration. If a device containing the memory circuit 200 behaves badly later on or even gets sent back to the semiconductor manufacturer by the customer as field failure, the manufacturer may detect therein valuable information on the history of the device.

Figure 3A:
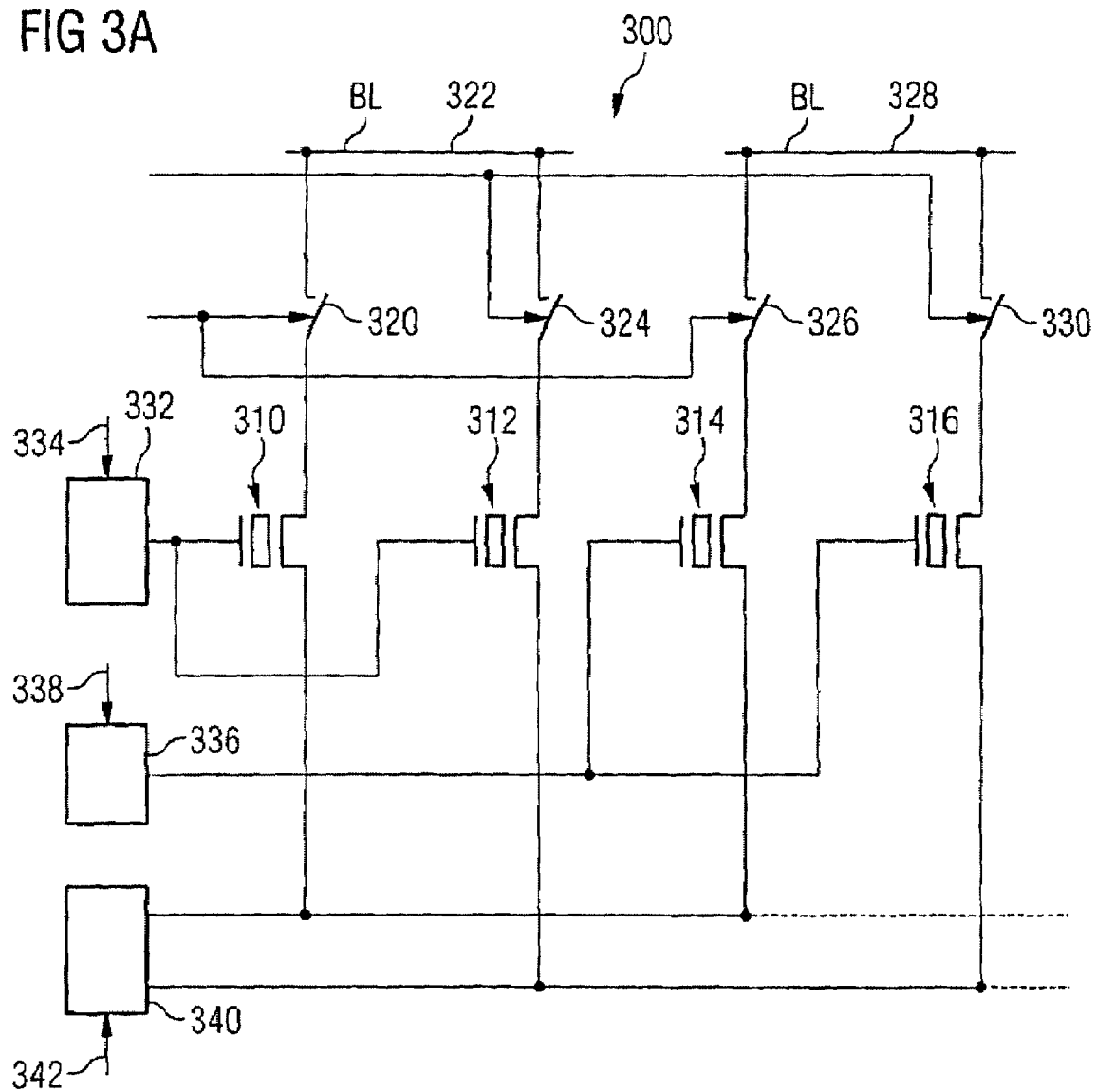
FIG. 3a shows a circuit diagram of a memory circuit according to a third embodiment.

FIG. 3a shows a circuit diagram of a memory circuit according to an embodiment. The memory circuit of FIG. 3a is designated 300 in its entirety. The memory circuit 300 comprises four memory transistors 310, 312, 314, 316, each including an associated floating gate electrode. A drain terminal of the first memory transistor 310 is coupled to a first bit line 322 via a first, switch 320. A drain terminal of the second memory transistor 312 is coupled to the first bit line 322 via a second switch 324. Furthermore, a drain terminal of the third transistor 314 is coupled to a second bit line 328 via a third switch 326. A drain terminal of the third memory transistor 316 is further coupled, to the second bit line 328 via a fourth switch 330.

Gate terminals of the first memory transistor 310 and the second memory transistor 312 are further coupled to a first gate drive circuit 332 designed to receive first write data 334 and to drive the gate terminals of the first memory transistor 310 and the second memory transistor 312 in write operation depending on the first, write data 334. Gate terminals of the third memory transistor 314 and the fourth memory transistor 316 are also connected to each other and further coupled to a second gate drive circuit 336. The second gate drive circuit 336 is designed to receive second write data 338 and to drive the gate terminals of the third memory transistor 314 and the fourth memory transistor 316 depending on the second write data 338.

Furthermore, source terminals of the first memory transistor 310 and the third memory transistor 314 are connected to each other and coupled to a source drive circuit 340. Similarly, source terminals of the second memory transistor 312 and the fourth memory transistor 316 are connected to each other and coupled to the source drive circuit 340. The source drive circuit 340 is designed to receive address information 342 and to drive the source terminals of the memory transistors 310, 312, 314, 316 in write operation so that either the states stored in the first memory transistor 310 and in the third memory transistor 314 may be changed, while the states stored in the second memory transistor 312 and the fourth memory transistor 316 remain unchanged, or vice versa.

It is further noted that the first switch 320 and the third switch 326 are preferably driven in the same way depending on address information. In other words, the control inputs of the first switch 320 and the third switch 326 are preferably connected to each other. Similarly, the second switch 324 and the fourth switch 330 are driven simultaneously. Furthermore, it is to be noted that, in readout operation, either the first switch 320 and the third switch 326 or the second switch 324 and the fourth switch 330 are closed, but never all switches 320, 324, 326, 330 at the same time. In write operation, however, the switches 320, 324, 326, 330 are all open.

It is further to be noted that the first memory transistor 310 and the third memory transistor 314 together form a first memory page. The second memory transistor 312 and the fourth memory transistor 316 form a further second memory page. During readout, the two bit lines 322, 328 may thus either pass on memory contents of the first memory page (when the first switch 320 and the third switch 326 are closed) or pass on memory contents of the second memory page (and/or memory bank) (when the second switch 324 and the fourth switch 330 are closed).

It may thus generally be said that the source terminals of memory transistors associated with one memory page (memory bank) are preferably connected to each other, and that the drain-side switches of memory transistors associated with one memory page are driven simultaneously and/or in an equal manner. On the other hand, it is to be noted that memory transistors associated with the same bit line 322, 328 have a common gate driving.

It is further to be noted that the memory circuit 300 may be extended by further memory transistors, wherein source terminals of all memory transistors associated with the same memory bank may be coupled to each other.

Figure 3B:
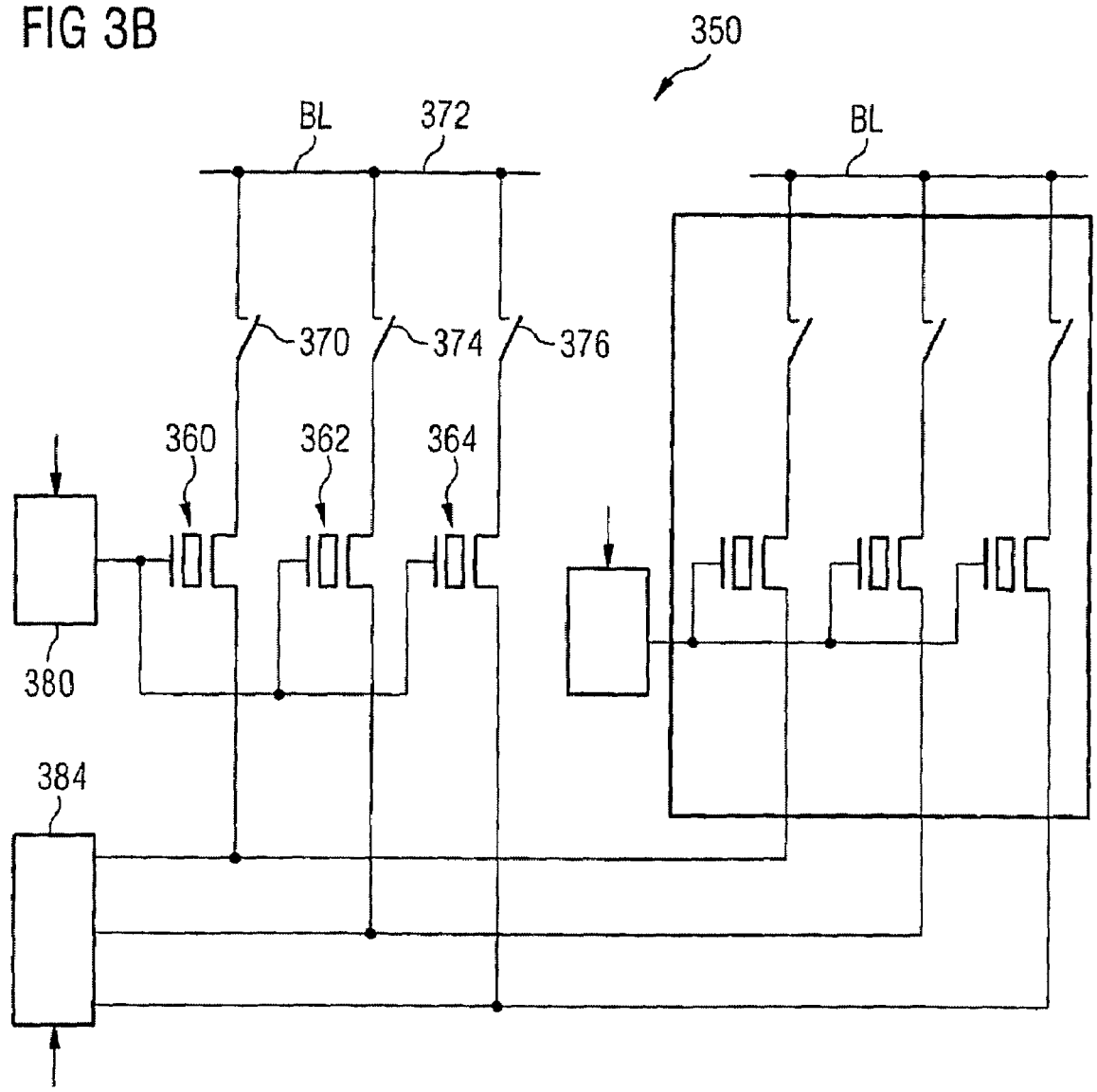
FIG. 3b shows a circuit diagram of a memory circuit according to a fourth embodiment.

FIG. 3b shows a circuit diagram of a memory circuit according to a fourth embodiment. The memory circuit 350 includes a first memory transistor 360, a second memory transistor 362 and a third memory transistor 364. A drain terminal of the first memory transistor 360 is coupled to a first bit line 372 via a first switch 370. A drain terminal of the second memory transistor 362 is further coupled to the first bit line 372 via a second switch 374. A drain terminal of the third memory transistor 364 is coupled to the first bit line 372 via a third switch 376. The gate terminals of the three memory transistors 360, 362, 364 are connected to each other and further coupled to a common gate drive circuit 380. The gate drive circuit 380 fulfills the same function as the gate drive circuits 332, 336 of the memory circuit 300. The source terminals of the three memory transistors 360, 362, 364 are further coupled to a source drive circuit 384. The source drive circuit 384 is designed to drive exactly one source terminal of one of the three memory transistors 360, 362, 364 in write mode so that a state stored in the respective memory transistor may be changed. Furthermore, the source drive circuit 384 is designed to drive the source terminals of the remaining memory transistors so that the state stored respectively therein is not changed irrespective of the drive signals supplied by the gate drive circuit 380.

The concept thus also works when more than two memory transistors receive a common gate driving. The corresponding driving of the associated source terminals is done such that, in a group of several memory transistors with a common gate driving, a distinction is made between exactly one memory transistor to be written to and the remaining memory transistors not to be written to. Gate terminals of the memory transistors not to be written to may be driven with the same signals, or different separate control signals may be used, as long as it is ensured that the state stored in the memory transistors not to be written to is not changed.

Besides, the circuit concept described with respect to FIG. 3a to connect the source terminals of several memory transistors may also be used when more than two memory transistors are coupled to one bit line. It is further to be noted that the shown memory circuit 350 comprises three memory pages and/or memory banks. For example, the first memory transistor 360 belongs to a first memory page, whereas the second memory transistor 362 belongs to a second memory page, and the third memory transistor 364 belongs to a third memory page.

Figure 3C:
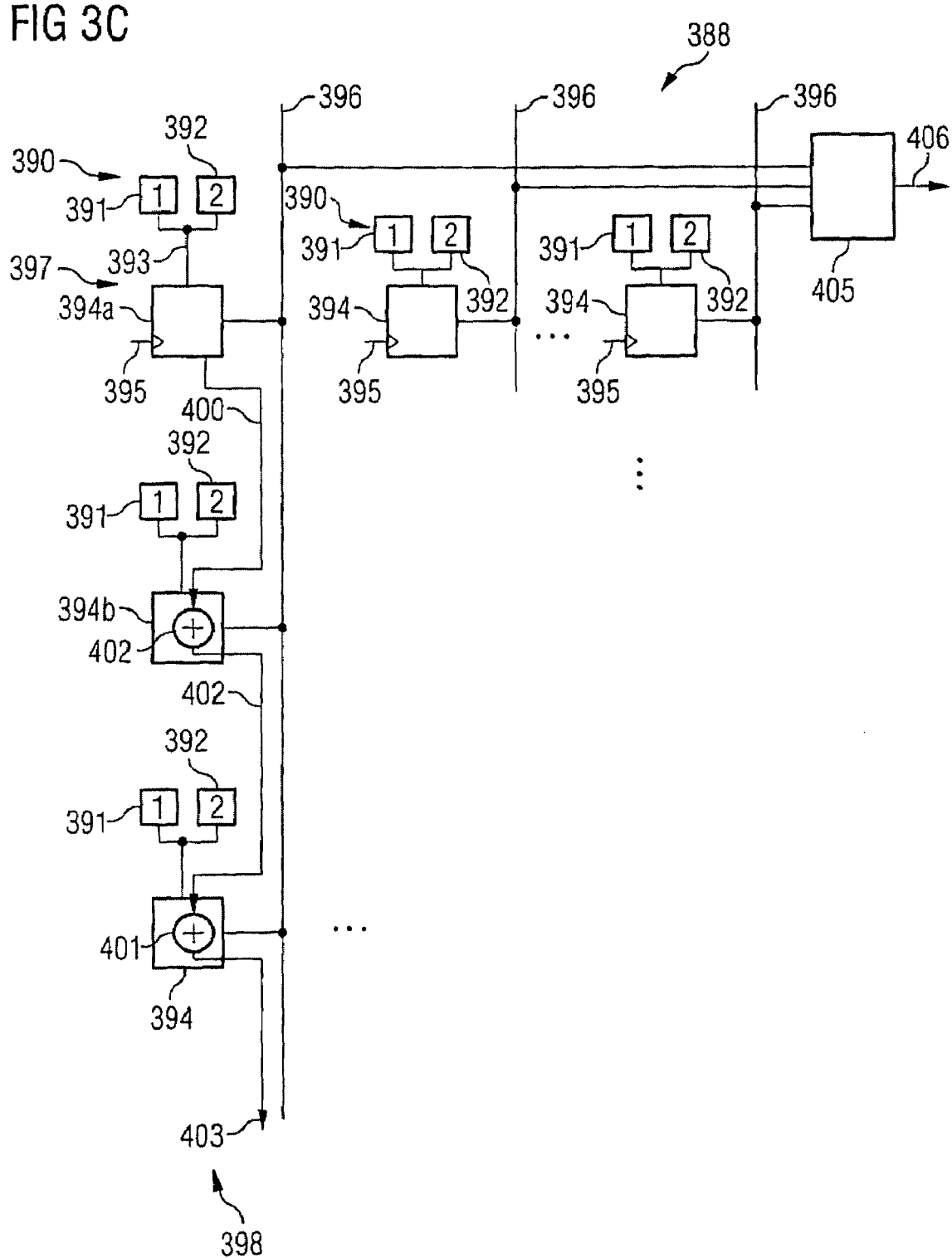
FIG. 3c shows a block, circuit diagram of a memory circuit according to a fifth embodiment.

FIG. 3c shows a block circuit diagram of a memory circuit according to a fifth embodiment. The memory circuit of FIG. 3c is designated 388 in its entirety. The memory circuit 388 includes a plurality of memory cells 390, each including two memory transistors, as an example. A first group of memory transistors, designated 391, belongs to a first memory page. A second group of memory transistors, designated 392, belongs to a second memory bank. In the shown embodiment of FIG. 3c, always two memory transistors share one bit line 393 and are connected to a register 394, 394a, 394b via the bit line. Thus, the memory transistors of the first group 391 of memory transistors correspond to the first memory transistor 210 of the memory circuit 200 shown in FIG. 2a. The transistors of the second group 392 of memory transistors further correspond to the memory transistors 212 of the memory circuit 200 shown in FIG. 2a. Besides, the bit line 393 corresponds to the bit line 222 of the memory circuit 200. The memory circuit 388 further includes high voltage NMOS field effect transistors corresponding to the high voltage NMOS field effect transistors 220, 224 of the memory circuit 200. However, these high voltage NMOS field effect transistors are not shown in the graphical representation of FIG. 3c for reasons of clarity. Neither does the graphical representation of FIG. 3c show a drive circuit designed to determine based on the address information whether the memory transistors of the first group 391 of memory transistors or the memory transistors of the second group 392 of memory transistors are to be read. However, it is to be noted that the registers 394 may selectively latch the contents of the memory transistors of the first group 391 of memory transistors or of the memory transistors of the second group 392 of memory transistors due to a clock signal 395 depending on the address information not shown.

Furthermore, it is to be noted that outputs of the registers 394 may be coupled to parallel data lines 396 (or column data lines), on which the memory contents of a row 397 of memory elements or registers may be output simultaneously. The output of a row of memory registers may, in turn, be done by a selection logic based on address information. Furthermore, it is to be noted that a plurality of registers 394 are connected to a single one of the parallel data lines 397, which thus form a column 398 of the memory. It is further to be noted that the registers 394 are designed to generate a column-wise parity signal. The parity signal is designated 400. A first register 394a of a column, i.e. for example a register with, the lowest row number, generates an original parity signal, wherein the original parity signal reflects a state of the register output, of the first register 394a of a column 398. A following register 394b of the same column 398 then receives the original parity signal 400 and supplies it to an XOR combination 401, wherein the original parity signal 400 is XORed with a signal present at an output of the following register 394b. In the XOR combination 401, a further parity signal 400 is generated, which thus takes into account the data stored in the first register cell and the second register cell of the respective column 398. The further parity signal 400 is then passed on through several further register cells 394 and respectively XORed with the date stored in the respective register cells 394. Thus, a column parity signal 403 of the column 398 is generated, which reflects a parity of the data stored in registers of all register cells 394 of the column 398.

Besides, it is to be noted that a corresponding calculation of further column parity signals may be performed analogously for the remaining columns of the memory.

Furthermore, in an embodiment, the memory circuit 388 comprises a further parity calculation means 405 coupled to the parallel data lines 396. The further parity calculation means 405 may calculate a parity of the data present on the parallel data lines 396 and thus provide a row parity signal 406 for a selected row 397.

In the memory circuit 386 shown, there may thus be performed an automatic error correction and/or a matrix parity check. The matrix parity check and the automatic error correction may be done similarly to conventional circuits using the row parity signal 406 and/or the column parity signals 403 of the columns 398. Besides, it is to be noted that, in the circuit according to an embodiment, the matrix parity check does only work page-wise due to the presence of several memory pages. For this purpose, a respective page to be read out and/or to be checked is latched into the EEPROM registers contained in the register cells 394. The column parities and/or the column parity signals 403 are calculated with the vertical XORs 401 of the register outputs. For a detailed representation, see FIG. 6, which shows, for example, an XOR gate 660 combining an output signal of the EEPROM input/output register cell 650 with a parity input signal parity_i to obtain a parity output signal parity_o that may be passed on to a subsequent stage. A row parity, however, is only calculated via the parallel data lines and/or output lines 396, which are designated bitpar_io<15:0>, for example, in the block circuit diagram 500 of FIG. 5. This means that each page contains its column and row parities and is thus corrected completely independent of the other pages.

In other words, in order to be able to evaluate a column parity, the information of the same memory page has to be loaded into all register cells 394 belonging to a column, so that a meaningful column parity signal 403 may be calculated.

By doubling the bits stored in the memory circuit 388, according to an embodiment, due to the additional use of the second (memory) page, the reliability of the EEPROM is halved. The error probability thus increases only linearly. When there are two (memory) pages, there is thus twice the probability that a non-correctable error occurs (as compared to a memory circuit with only one memory page). However, if the matrix parity check extended over 2×N bits instead of N bits, the error probability would be larger by the factor 4.

The following discusses the testability of the EEPROM architecture and/or the memory circuit. It is to be noted that the reliability discussed above (with respect to an automatic error correction and a matrix parity check) only considers the influence of the core EEPROM cell (= floating gate electrode with launching transistor and EENMOS transistor, also referred to as "floating gate"). The reliability of the remaining devices of the memory circuit is of inferior significance in most cases. Still, a wafer test of the memory circuit first has to verify that all transistors are operable. In this respect, the described embodiments have the advantage that many transistors of (memory) page 1 and (memory) page 2 are used commonly. Thus, the testing effort does not have to be doubled in spite of the double number of bits for two (memory) pages as compared to one (memory) page. The testing effort increases sublinearly. As an example, consider that it has to be tested, for example, whether the current mirror formed by the field effect transistor 230 (also referred to as PR) actually impresses a sufficient reading current in a node connected to the bit line 222 (also referred to as node bit). However, since all pages share the node bit, the PMOS transistor 230 (also referred to as PR) has only to be tested once.

Figure 6:
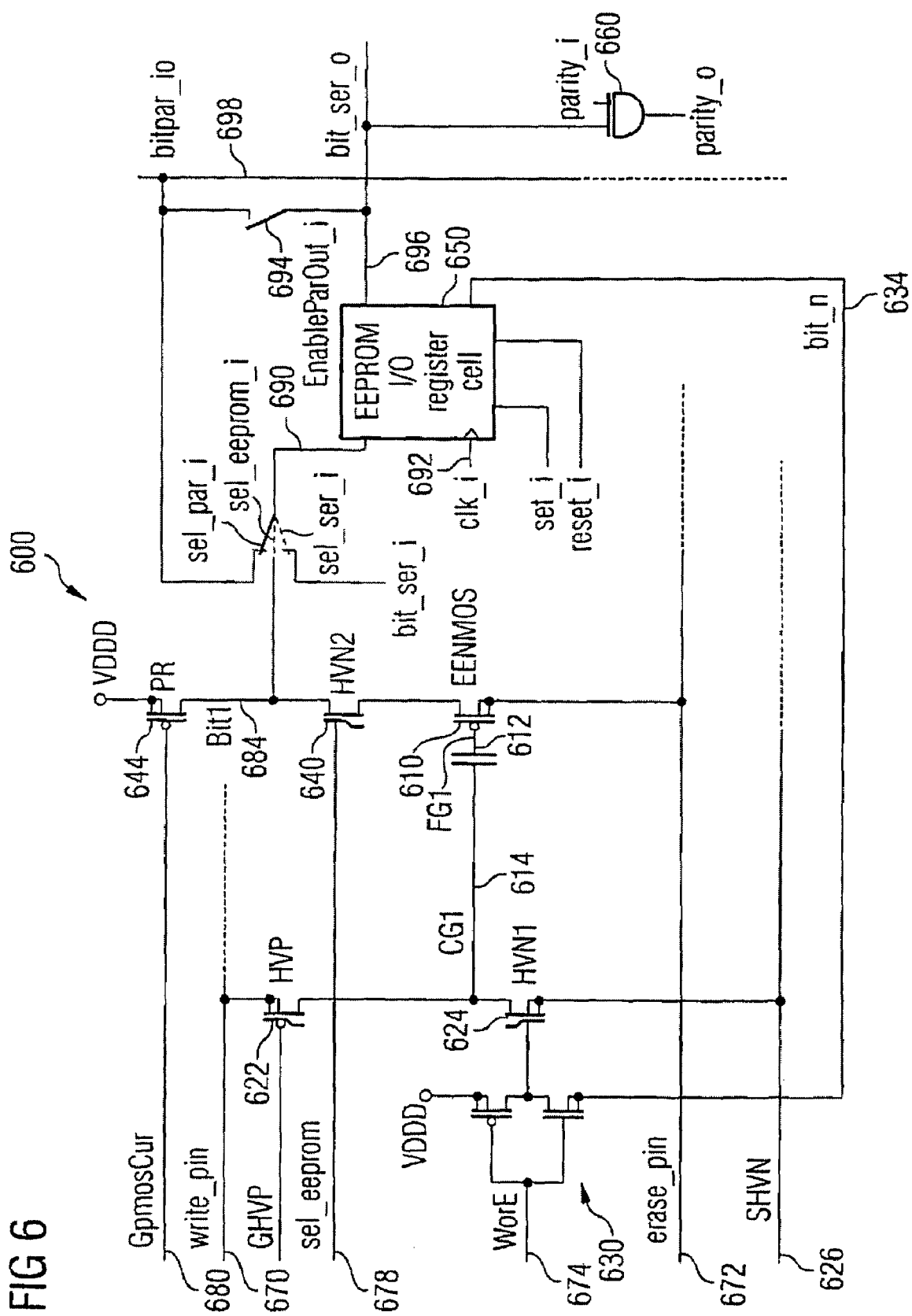
FIG. 6 shows a circuit diagram of a conventional EEPROM cell including its associated register cell.

The following illustrates the advantages of the circuit with respect to (manufacturing) effort and consumption of chip area. It is apparent from FIG. 2*a* that, for the shown case of two (memory) pages, the additional effort of the realization of the second (memory) page is to build in the core EEPROM (= launching capacitor between CG and FG2) and the second high voltage NMOS field effect transistor 224 with the second page selection line 276 (sel_p2 line). The first high voltage PMOS transistor 242, the third high voltage NMOS transistor 246, the PMOS transistor 230 (PR) and the register cell connected to the bit line 222 (whose detailed structure is shown in FIG. 6) may be used commonly by all (memory) pages. This allows to significantly save chip area. It has been shown that only 1.3 times more chip area is required for two (memory) pages than for a single (memory) page.

Besides, it is also possible to store the same data as on the first (memory) page on the second (memory) page to thus increase the reliability of the storage and/or to detect bit errors with higher probability. It is possible to store an identical bit pattern on the second memory page as on the first memory page. Of course, it is better to invert the bits or even mix them or exchange them with each other (scrambled), so that perturbation immunity with respect to systematic errors is increased.

As shown with respect to FIG. 3*b*, the principle may even be extended to more than two (memory) pages. However, the access time for reading out the memory transistors (EENMOS1, EENMOS2, . . . ) becomes larger, because the parasitic capacitance and also the leakage currents on the bit line 222, 372 and/or at the node bit increase by the multiplication of the high voltage NMOS transistors 220, 224, 370, 374, 376.

FIG. 4 further shows a flowchart of a method according to a sixth embodiment. The method shown in FIG. 4 is designed to write memory data into a memory circuit 100, 200. The method shown in FIG. 4 is designated 400 in its entirety. A first step 410 includes receiving write data and receiving address information for the selection of a memory page to be written to. A second step 420 includes providing two equal signals for the gate terminals of a first memory transistor and a second memory transistor based on the write data. In other words, equal signals are applied to the gate terminals of two memory transistors, whose level depends on the data value of the write data. A third step 430 includes providing a programming signal for a source terminal of a memory transistor to be written to of the first memory transistor and the second memory transistor. The programming signal is chosen so that a state of the memory transistor to be written to may be changed. For example, a potential difference between the signal present at the gate terminals of the memory transistor to be written to from the signal present at the source terminal of the memory transistor to be written to may preferably be selected such that a charge on a floating gate electrode of the memory transistor to be written to may be changed. Besides, the selection which one of the two memory transistors is the memory transistor to be written to depends on the address information received in the first step 410.

A fourth step 440 preferably executed in parallel to the third step 430 further includes driving a source terminal of the memory transistor not to be written to such that a state stored in the memory transistor not to be written to is not changed. Here, the source terminal of the memory transistor not to be written to is preferably driven such that a gate-source potential difference of the memory transistor not to be written to is sufficiently small so that Fowler-Mordheim tunneling of charge carriers from or to the floating gate electrode of the memory transistor not to be written to is negligibly small.

It is to be noted that the method 400 may be extended by all those steps and/or by those functionalities that have been described above with respect to the device according to the different embodiments. Furthermore, the method may be designed to generate the waveforms 282, 284, 286 and/or 288 shown in FIG. 2*b*. Furthermore, the method may be designed to drive more than two transistors at the same time, such as described with respect to FIGS. 3*a* and 3*b*. For example, the second step 420 may include providing more than two signals for the gate terminals of more than two memory transistors (cf. gate drive circuit 380 of the memory circuit 350). Furthermore, the third step 430 may include providing a programming signal for more than one source terminal of a memory transistor (cf. source drive circuit 340 of the memory circuit 300). Likewise, the fourth step 440 may include driving several source terminals of several memory transistors not to be written to (cf. source drive circuit 340 of the memory circuit 300 and source drive circuit 384 of the memory circuit 350).

Furthermore, it is to be noted that the above circuits have been described using N channel memory transistors. However, a complementary circuit arrangement is also conceivable, in which N channel, transistors are replaced by P channel transistors and vice versa. In a complementary circuit, signs of potentials and/or potential differences are further opposite, while magnitude-wise relations are maintained. Furthermore, some of the field effect transistors shown with respect to the drive circuit may also be replaced by bipolar transistors. In addition, it is to be noted that, in the present application, the term "high voltage transistor" refers to a transistor with an electric strength of more than 10 volts. High voltage transistors thus have an increased electric strength as compared to transistors not characterized as "high voltage transistors".

In summary, it may thus be said, with respect to FIG. 2a that according to the described embodiments, the control gate terminals (control gates) of several EEPROM core cells are combined, while the source terminals of the EEPROM transistors are separated and the drain terminals of the EEPROM transistors are connected to the common node bit (i.e. to the bit line 223) via high voltage NMOS transistors. If two EEPROM core cells are connected in that way, two (memory) pages may thus be defined, which may be selected via the gate terminals of the high voltage NMOS selection transistors 220, 224 (HVN1, HVN2) during readout.

According to the present embodiments, several control gate terminals (control gates) of further EEPROM cells may thus be connected to one node, designated CG. The NMOS-EEPROM transistors of these cells (designated EENMOS1 and EENMOS2 and/or 210, 212) have associated with them high voltage NMOS transistors (also designated HVN1 and HVN2 and/or 220, 224), which are all connected together at the node bit and/or at the bit line 222 with their source terminals and/or drain terminals. Each of the above-mentioned cells has its dedicated erase line 270, 272 (also referred to as erase_pin lines erase_pin1, erase_pin2) and its dedicated (page) selection signal 274, 276 (also referred to as select signal sel_p1 and/or sel_p2) for the first cell and the second cell at the common CG node.

Further cells may be correspondingly connected in parallel, such as it is shown in FIG. 3b, so that there are more than two (memory) pages. The entirety of all cells associated with a page selection line 274, 276 then forms a memory page. For example, the entirety of all cells associated with the first page selection line sel_p1 per definition forms the (memory) page 1 (page1) of the EEPROM, while all cells with p2 belong to a second (memory) page p2. Besides, it is to be noted that the register (and/or the register cell), the column XOR gates and the vertical parallel data lines (bitpar_io lines) remain essentially unchanged as compared to the arrangements described with respect to FIGS. 5 and 6 (cf. register cell 650, XOR gate 660, parallel column data lines 540, 698).

The present embodiments thus provide for memory circuits allowing an increase in memory capacity as compared to conventional memory circuits, wherein there are only comparably little additional chip area requirements. Thus, an inexpensive realization of a rewritable memory, for example in an integrated sensor circuit is possible.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A drive circuit for driving a memory with a first nonvolatile memory transistor with a floating gate electrode and a gate terminal, and a second non-volatile memory transistor with a floating gate electrode and a gate terminal, and a first switch connected between a drain terminal of the first memory transistor and a bit line for reading out information stored in the memory circuit, and a second switch connected between a drain terminal of the second memory transistor and the bit line, wherein the first switch and the second switch are formed to selectively couple the drain terminal of the first memory transistor or the drain terminal of the second memory transistor to the bit line during readout, for writing write data into one of the memory transistors, comprising:

means for providing equal signals for the gate terminals of the first memory transistor and the second memory transistor based on the write data;

means for providing a programming signal for a source terminal of the memory transistor to be written to, wherein the programming signal is formed to allow a state stored in the memory transistor to be written to to be changed; and means for driving a source terminal of a memory transistor not to be written to such that a state stored in the memory transistor not to be written to is not changed.

2. The memory circuit according to claim 1, wherein the drive circuit is formed to apply a first potential at the gate terminals of the memory transistors in write operation, to apply a programming signal with a second potential to the source terminal of the memory transistor to be written to, and to apply a third potential at the source terminal of the memory transistor not to be written to, wherein the drive circuit is formed to set the applied potentials, when writing a first data value, such that the second potential is lower than the first potential, and the third potential differs less from the first potential in magnitude than the second potential, and wherein the drive circuit is formed to set the applied potentials, when writing a second data value, such that the second potential is higher than the first potential, and the third potential differs less from the first potential than the second potential.

3. The memory circuit according to claim 1, wherein the drive circuit includes a gate drive circuit and a source drive circuit, wherein the source drive circuit drives the source terminals independent of the data value to be written, wherein the gate drive circuit applies a first gate write potential or a second gate write potential at the gate terminals of the memory transistors, when writing a data value, depending on the data value to be written, wherein, when writing, the source drive circuit further drives the source terminal of the memory transistor not to be written to so that a third potential is present at the source terminal of the memory transistor not to be written to, so that a state stored in the memory transistor not to be written to remains unchanged independent of the gate write potential, wherein the source drive circuit is formed to apply a second potential to the source terminal of the memory transistor to be written to in a first phase, the potential being selected so that a state stored in the memory transistor to be written to may be changed, when the first gate write potential is present, and that a state stored in the memory transistor to be written to remains unchanged, when the second gate write potential is present, wherein the source drive circuit is formed to apply a fourth potential to the source terminal of the memory transistor to be written to in a second phase, the potential being selected so that a state stored in the memory transistor to be written to may be changed, when the second gate write potential is present, and that a state stored in the memory transistor to be written to remains unchanged, when the first gate write potential is present.

4. The memory circuit according to claim 3, wherein the first gate write potential is higher than the second gate write potential, wherein the second potential is lower than the first gate write potential, and wherein the third potential is closer in magnitude to the first gate write potential than the second potential.

5. The memory circuit according to claim 3, wherein the first gate write potential is higher than the second gate write potential, wherein the fourth potential is higher than the second gate write potential, and wherein the third potential is closer in magnitude to the second gate write potential than the fourth potential.

6. The memory circuit according to claim 3, wherein a potential difference between the first gate write potential and the second potential is selected so that, when the first gate write potential is present at the gate terminal of the memory transistor to be written to and the second potential is present at the source terminal of the memory transistor to be written to, Fowler-Nordheim tunneling occurs through a gate isolator of the memory transistor to be written to, so that a charge on the floating gate electrode of the memory transistor to be written to changes to change a state stored in the memory transistor to be written to, and wherein a potential difference between the second gate write potential and the fourth potential is selected so that, when the second gate write potential is present at the gate terminal of the memory transistor to be written to and the second potential is present at the source terminal of the memory transistor to be written to, Fowler-Nordheim tunneling occurs through a gate isolator of the memory transistor to be written to, so that a charge on the floating gate electrode of the memory transistor to be written to changes to change a state stored in the memory transistor to be written to.

7. The memory circuit according to claim 3, wherein a potential difference between the first gate write potential and the third potential is such that Fowler-Nordheim tunneling through a gate isolator of the memory transistor not to be written to is negligible, so that a state stored in the memory transistor not to be written to remains unchanged.

8. The memory circuit according to claim 3, wherein the memory transistors comprise NMOS transistors with a floating gate electrode, and wherein a potential difference between the first gate write potential and the third potential is larger than a threshold voltage of the memory transistor not to be written to, so that the memory transistor not to be written to is in a conductive state, when the first gate write potential is present at its gate terminal and the third potential is present at its source terminal.

9. A method for writing write data into a memory transistor in a memory circuit with a first non-volatile memory transistor with a floating gate electrode and a gate terminal, a second non-volatile memory transistor with a floating gate electrode and a gate terminal, a first switch connected between a drain terminal of the first memory transistor and a bit line for reading out information stored in the memory circuit, and a second switch connected between a drain terminal of the second memory transistor and the bit line, wherein the first switch and the second switch are formed to selectively couple the drain terminal of the first memory transistor or the drain terminal of the second memory transistor to the bit line during readout, into one of the memory transistors in a write operation, comprising:

receiving write data;
providing equal signals for the gate terminals of the first memory transistor and the second memory transistor based on the write data;
providing a programming signal for a source terminal of the memory transistor to be written to, wherein the programming signal is formed to allow a state stored in the memory transistor to be written to be changed; and
driving a source terminal of a memory transistor not to be written to of the first memory transistor and the second memory transistor such that a state stored in the memory transistor not to be written to is not changed.

10. The method according to claim 9, further comprising:
applying a first potential at the gate terminals of the memory transistors in the write operation;
applying a programming signal with a second potential to the source terminal of the memory transistor to be written to;
applying a third potential to the source terminal of the memory transistor not to be written to,
wherein when writing a first data value, the second potential is lower than the first potential, and wherein the third potential is closer in magnitude to the first potential than the second potential, and
wherein when writing a second data value, the second potential is higher than the first potential, and the third potential is closer in magnitude to the first potential than the second potential.

11. The method according to claim 9, wherein the source terminals are driven independent of the data value to be written,
wherein a first gate write potential or a second gate write potential are driven at the gate terminals of the memory transistors, when writing a data value, depending on the data value to be written,
wherein when writing, the memory transistor not to be written to has a third potential present at the source terminal thereof, so that a state stored in the memory transistor not to be written to remains unchanged independent of the first gate write potential or the second gate write potential,
wherein a second potential is applied to the source terminal of the memory transistor to be written to in a first phase, the second potential being selected so that a state stored in the memory transistor to be written to may be changed, when the first gate write potential is present, and that a state stored in the memory transistor to be written to remains unchanged, when the second gate write potential is present, and
wherein a fourth potential is applied to the source terminal of the memory transistor to be written to in a second phase, the potential being selected so that a state stored in the memory transistor to be written to may be changed, when the second gate write potential is present, and that a state stored in the memory transistor to be written to remains unchanged, when the first gate write potential is present.

12. The method according to claim 11, wherein the first gate write potential is higher than the second gate write potential, wherein the second potential is lower than the first gate write potential, and wherein the third potential is closer in magnitude to the first gate write potential than the second potential.

13. The method according to claim 11, wherein the first gate write potential is higher than the second gate write potential, wherein the fourth potential is higher than the second gate write potential, and wherein the third potential is closer in magnitude to the second gate write potential than the fourth potential.

14. The method according to claim 11, wherein a potential difference between the first gate write potential and the second potential is selected so that, when the first gate write potential is present at the gate terminal of the memory transistor to be written to and the second potential is present at the source terminal of the memory transistor to be written to, Fowler-Nordheim tunneling occurs through a gate isolator of the memory transistor to be written to, so that a charge on the floating gate electrode of the memory transistor to be written to changes to change a state stored in the memory transistor to be written to, and wherein a potential difference between the second gate write potential and the fourth potential is selected so that, when the second gate write potential is present at the gate terminal of the memory transistor to be written to and the second potential is present at the source terminal of the memory transistor to be written to, Fowler-Nordheim tunneling occurs through a gate isolator of the memory transistor to be written to, so that a charge on the floating gate electrode of the memory transistor to be written to changes to change a state stored in the memory transistor to be written to.

15. The method according to claim 11, wherein a potential difference between the first gate write potential and the third potential is such that Fowler-Nordheim tunneling through a gate isolator of the memory transistor not to be written to is negligible, so that a state stored in the memory transistor not to be written to remains unchanged.

16. The method according to claim 11, wherein the memory transistors comprise NMOS transistors with a floating gate electrode, and wherein a potential difference between the first gate write potential and the third potential is larger than a threshold voltage of the memory transistor not to be written to, so that the memory transistor not to be written to is in a conductive state, when the first gate write potential is present at its gate terminal and the third potential is present at its source terminal.

17. A memory circuit comprising:
a first non-volatile memory transistor with a floating gate electrode and a gate terminal; and
a second non-volatile memory transistor with a floating gate electrode and a gate terminal;
a first switch connected between a drain terminal of the first memory transistor and a bit line for reading out information stored in the memory circuit;
a second switch connected between a drain terminal of the second memory transistor and the bit line, wherein the first switch and the second switch are formed to selectively couple the drain terminal of the first memory transistor or the drain terminal of the second memory transistor to the bit line during readout; and
means for writing data into one of the memory transistors, wherein the means are designed to apply equal signals to the gate terminals of the first memory transistor and the second memory transistor based on the write data, to apply a programming signal at a source terminal of the memory transistor to be written to, and to drive a source terminal of a memory transistor not to be written to such that a state stored remains unchanged.

18. The memory circuit according to claim 17, wherein a first terminal of the first switch is connected to the drain terminal of the first memory transistor, wherein a second terminal of the first switch is connected to the bit line, wherein a first terminal of the second switch is connected to the drain terminal of the second memory transistor, and wherein a second terminal of the second switch is connected to the bit line.

* * * * *